(12) United States Patent
Ito

(10) Patent No.: US 9,666,648 B2
(45) Date of Patent: May 30, 2017

(54) ORGANIC ELECTROLUMINESCENT DISPLAY DEVICE HAVING AN INPUT FUNCTION

(71) Applicant: Japan Display Inc., Tokyo (JP)

(72) Inventor: Ryoichi Ito, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/093,045

(22) Filed: Apr. 7, 2016

(65) Prior Publication Data

US 2016/0225831 A1 Aug. 4, 2016

Related U.S. Application Data

(63) Continuation of application No. 14/480,875, filed on Sep. 9, 2014, now Pat. No. 9,343,513.

(30) Foreign Application Priority Data

Sep. 11, 2013 (JP) .................................. 2013-188128

(51) Int. Cl.
*H01L 27/32* (2006.01)
*G06F 3/041* (2006.01)
(Continued)

(52) U.S. Cl.
CPC ............ *H01L 27/323* (2013.01); *G06F 3/044* (2013.01); *G06F 3/0412* (2013.01);
(Continued)

(58) Field of Classification Search
CPC ... H01L 27/323; H01L 27/3279; G06F 3/041; G06F 3/0412; G06F 3/044
See application file for complete search history.

(56) References Cited

U.S. PATENT DOCUMENTS 9,342,176 B2 * 5/2016 Kim ..................... G06F 3/0412
2008/0211395 A1 * 9/2008 Koshihara ............... G06F 3/044
313/504

(Continued)

FOREIGN PATENT DOCUMENTS

JP 2002-299044 A 10/2002
JP 2007-157404 A 6/2007
(Continued)

OTHER PUBLICATIONS

Japanese Office Action mailed on Mar. 14, 2017 for counter Japanese Application No. 2013-188128 with partial translation.

*Primary Examiner* — Roy Potter
*Assistant Examiner* — Paul Patton
(74) *Attorney, Agent, or Firm* — TYPHA IP LLC

(57) ABSTRACT

An organic electroluminescent display device includes a first substrate having a pixel area including a plurality of pixels each including a plurality of sub pixels, a light emitting devices are provided in correspondence with the sub pixels, and a partition layer covering a peripheral portion of each of the sub pixels; and a second substrate having a sensing unit including a first electrode pattern extending in one direction and a second electrode pattern extending in a direction intersecting the one direction, and the first electrode pattern and the second electrode pattern is provided out of contact from each other. The first electrode pattern is located to overlap the partition layer so as to enclose the sub pixels. The first electrode pattern included in the sensing unit encloses the sub pixels, and thus light is prevented from leaking to adjacent sub pixels.

20 Claims, 29 Drawing Sheets

(51) Int. Cl.
  *G06F 3/044* (2006.01)
  *H01L 51/52* (2006.01)

(52) U.S. Cl.
  CPC ...... *H01L 27/3223* (2013.01); *H01L 27/3246* (2013.01); *H01L 27/3272* (2013.01); *H01L 27/3279* (2013.01); *H01L 51/5271* (2013.01)

(56) References Cited

U.S. PATENT DOCUMENTS

| | | |
|---|---|---|
| 2009/0273572 A1 | 11/2009 | Edwards et al. |
| 2010/0013745 A1 | 1/2010 | Kim et al. |
| 2012/0105337 A1 | 5/2012 | Jun et al. |
| 2015/0253910 A1* | 9/2015 | Lee .................. G06F 3/044 345/173 |

FOREIGN PATENT DOCUMENTS

| | | |
|---|---|---|
| JP | 2007-220395 A | 8/2007 |
| JP | 2008-129708 A | 6/2008 |
| JP | 2008-216543 A | 9/2008 |
| JP | 2009-271923 A | 11/2009 |
| JP | 2009-283201 A | 12/2009 |
| JP | 2010-028115 A | 2/2010 |
| JP | 2012-098687 A | 5/2012 |
| JP | 2013-161448 A | 8/2013 |

\* cited by examiner

ORGANIC ELECTROLUMINESCENT DISPLAY DEVICE HAVING AN INPUT FUNCTION

CROSS REFERENCE TO RELATED APPLICATIONS

This application is a continuation of U.S. patent application Ser. No. 14/480,875, filed on Sep. 9, 2014. Further, this application is based upon and claims the benefit of priority from the prior Japanese Patent Application No. 2013-188128, filed on Sep. 11, 2013, the entire contents of which are incorporated herein by reference.

FIELD

The present invention relates to an organic electroluminescent display device having an input function.

BACKGROUND

Organic electroluminescent display devices including a substrate which has light emitting devices each controlled independently and provided in accordance with pixels, and also including a counter substrate located to face the substrate, in which light emitted by the light emitting device in each pixel is visually recognized through the counter substrate to provide information display or the like are now being developed. Such an organic electroluminescent display device is of a top emission type, and in the case where light emitted by the light emitting device is so-called white light, the counter substrate includes a color filter.

In an organic electroluminescent display device that provides color display, one pixel includes, for example, a red pixel, a green pixel and a blue pixel. The light emitting intensity of the light emitting device of the color pixel of each color is changed in one pixel, so that the color tone is changed to provide color display. Therefore, the red pixel, the green pixel and the blue pixel included in one pixel are each referred to also as a "sub pixel".

The color filter is provided over the side of the pixel on which the light is output from the light emitting device. In the color filter, color layers (color filter layers) having different transmission spectra are defined in correspondence with the sub pixels. At a border between the color filter layers having different transmission spectra, a light shielding layer is provided.

The light shielding layer is provided in order to demarcate the sub pixels having different color elements so that color mixture which would otherwise occur between adjacent pixels (or sub pixels) is prevented. For example, Japanese Laid-Open Patent Publications No. 2002-299044 and Japanese Laid-Open Patent Publications No. 2007-220395 each disclose an organic electroluminescent display device in which a light shielding layer is provided to enclose a light emitting area of each pixel in order to prevent light leaks between adjacent pixels (sub pixels).

Recently, electronic devices including a graphical user interface which displays an image such as an icon or the like on a display screen and is operated by a touch on the image have been widely used. A display panel also having as an input function that is used in such an electronic device is also referred to as a touch panel (or touch screen). A mainstream touch panel is of an electrostatic capacitance system, which detects a change in the electrostatic capacitance of the sensor electrode and converts such an electrostatic capacitance into an input signal.

Japanese Laid-Open Patent Publication No. 2008-216543 discloses an organic electroluminescent display device having such an input function. In this organic electroluminescent display device, a part of the sensor electrode that detects a touch also acts as a light shielding layer.

The light shielding layer disclosed in each of Japanese Laid-Open Patent Publications Nos. 2002-299044 and 2007-220395 is provided only for the purpose of shielding light. In order to provide such an organic electroluminescent display device with a touch input function, a touch panel of an electrostatic capacitance system needs to be externally attached thereto. An organic electroluminescent display device having such an externally attached touch panel is increased in the size or the thickness and in the weight, and cannot be applied for an electronic device that needs to be thinner and more lightweight.

In the organic electroluminescent display device disclosed in Japanese Laid-Open Patent Publication No. 2008-216543, the light shielding layer also acts as a sensor electrode. However, the part acting as the sensor electrode is separated from a lattice portion that blocks light. Namely, a part of the light shielding unit acts as the sensor electrode. In other words, the light shielding unit includes a sensor electrode unit acting as the sensor electrode and a unit that does not act as the sensor electrode and acts only as a light shielding layer.

Therefore, the part also acting as the sensor electrode in a touch detection zone needs to be separated from the part acting only as the light shielding layer. In such a separation area, light leaks. In the case where the light shielding layer, which originally should block light, has such a separation area, display lines are recognized due to a luminance difference or the like and thus image quality is deteriorated.

SUMMARY

An organic electroluminescent display device in an embodiment according to the present invention includes a first substrate having a pixel area including a plurality of pixels each including a plurality of sub pixels, a light emitting devices are provided in correspondence with the sub pixels, and a partition layer covering a peripheral portion of each of the sub pixels; and a second substrate having a sensing unit including a first electrode pattern extending in one direction and a second electrode pattern extending in a direction intersecting the one direction, and the first electrode pattern and the second electrode pattern is provided out of contact from each other. The first substrate and the second substrate are located to face each other such that the pixel area and the first electrode pattern face each other; and the first electrode pattern is located to overlap the partition layer so as to enclose the sub pixels.

In another embodiment of the organic electroluminescent display device according to the present invention, it is preferable that a side surface of the first electrode pattern is inclined such that an open area in the first electrode pattern is opened toward the first substrate from the second substrate. In the structure in which the side surface of the first electrode pattern is inclined, it is preferable that the side surface of the first electrode pattern is a light-reflecting surface. In this case, it is preferable that the first electrode pattern includes at least an aluminum layer or an aluminum alloy layer, and the light-reflecting surface is formed of the aluminum layer or the aluminum alloy layer.

In still another embodiment of the organic electroluminescent display device according to the present invention, the first electrode pattern includes a plurality of first electrodes extending in the one direction and first inter-electrode patterns provided between the first electrodes while being out of contact from each other.

In still another embodiment of the organic electroluminescent display device according to the present invention, it is preferable that the first electrode pattern and the second electrode pattern have different patterns, and the second electrode pattern includes large square or rectangular shapes covering periods of the first electrode pattern.

In still another embodiment of the organic electroluminescent display device according to the present invention, it is preferable that the first electrode pattern and the second electrode pattern have substantially the same pattern as each other and are provided to overlap each other.

In still another embodiment of the organic electroluminescent display device according to the present invention, it is preferable that the second substrate includes a color filter layer between the first electrode pattern and the second electrode pattern, at a position overlapping each of the sub pixels.

DESCRIPTION OF EMBODIMENTS

Hereinafter, embodiments of the present invention will be described with reference to the drawings or the like. The present invention can be carried out in many different embodiments, and is not to be interpreted as being limited to any of the following embodiments.

In the following description of the present invention, elements having the same or similar functions will bear identical reference signs in different figures. For such elements, the same description will not be repeated unless there is a specific reason. In the present specification, in the case where certain components or areas are present "over" or "under" and "above" or "below" other components or areas, as long as there are no particular limitations, this includes not only the case where components or areas are directly above or directly below other components or areas but also the case where components or areas are above or below other components or areas with other structural components provided in between.

Embodiment 1

In this embodiment, an organic electroluminescent display device having an input function in which a part of electrodes that form a sensor plane of an input sensor also acts as a light shielding wall between sub pixels will be described.

(1) Organic Electroluminescent Display Device

Figure 1:
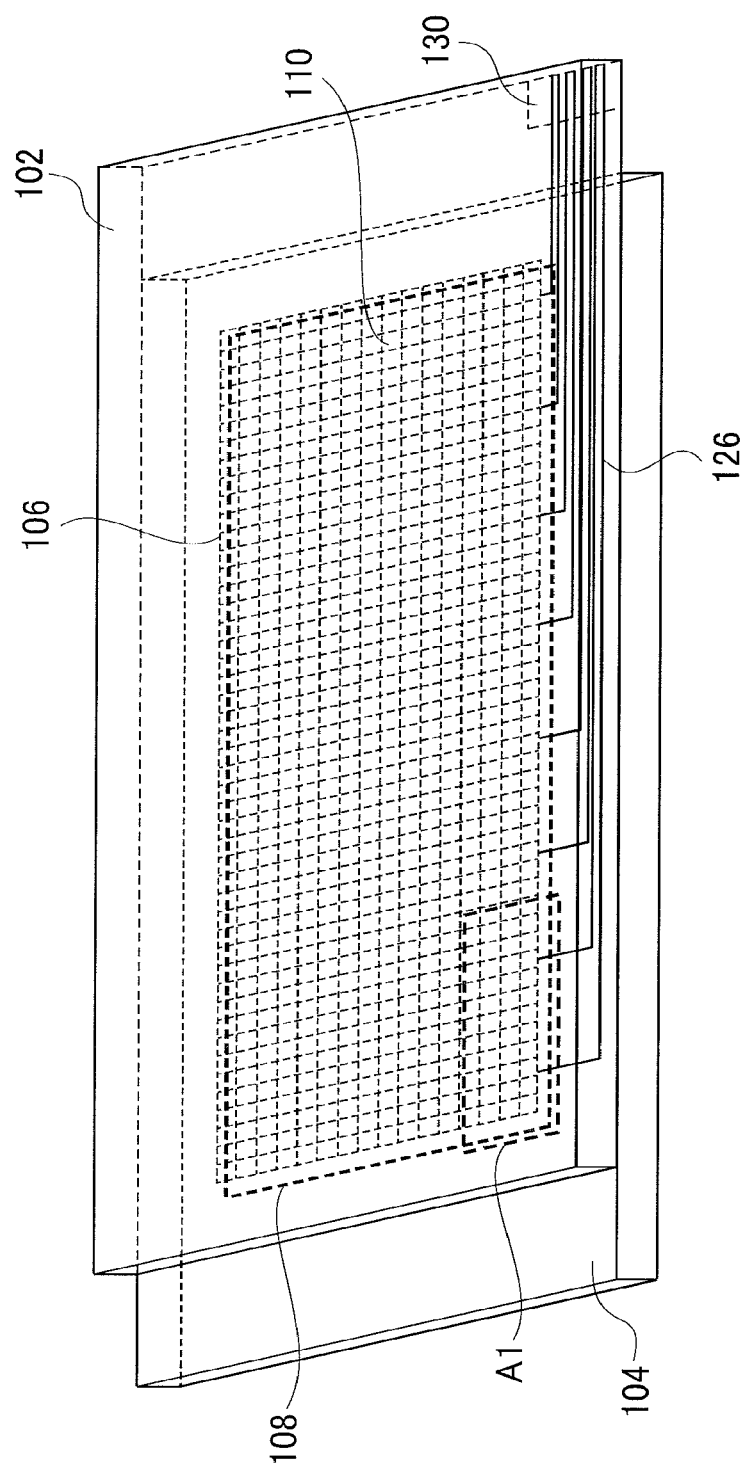
FIG. 1 is a perspective view showing an overview of an organic electroluminescent display device in an embodiment according to the present invention.

FIG. 1 shows an overview of an organic electroluminescent display device in this embodiment. The organic electroluminescent display device includes a second substrate 102 and a first substrate 104. The second substrate 102 and the first substrate 104 are located to face each other and secured to each other with a sealing member (not shown). In the following description, the first substrate comprises a substrate provided with the devices such as a transistor and the light emitting element, and the second substrate includes a substrate disposed to face the first substrate.

The organic electroluminescent display device includes a sensing unit 106 and a display pixel area 108. Owing to this, the organic electroluminescent display device in this embodiment has an input function. The display pixel area 108 and the sensing unit 106 are located to overlap each other. The sensing unit 106 includes a first electrode pattern extending in one direction (e.g., Y direction) and a second electrode pattern extending in a direction intersecting the one direction (e.g., X direction). In FIG. 1, the first electrode pattern 110 in the sensing unit 106 is shown whereas the second electrode pattern is omitted for the sake of simplicity.

Along a peripheral edge of the second substrate 102, a plurality of first lines 126 electrically connected to the first electrode pattern 110 are provided and integrated together. In an end area of the second substrate 102, a first terminal portion 130 connected to the first lines 126 is provided.

The display pixel area 108 includes a plurality of pixels provided in the display substrate 104. In the display pixel area 108, the pluralities of pixels are arrayed in, for example, a matrix. Each of the plurality of pixels includes a plurality of sub pixels. Each of the sub pixels acts as a color element structured to emit light of a single color (or light of a specific wavelength range) such as a red sub pixel, a green sub pixel or a blue sub pixel, and may be regarded as a minimum unit of the display pixel area 108. The plurality of sub pixels that emit light of different colors are put together to form one pixel. Thus, the display pixel area 108 can provide color display.

(2) Electrode Pattern in the Sensing Unit

Figure 2A:
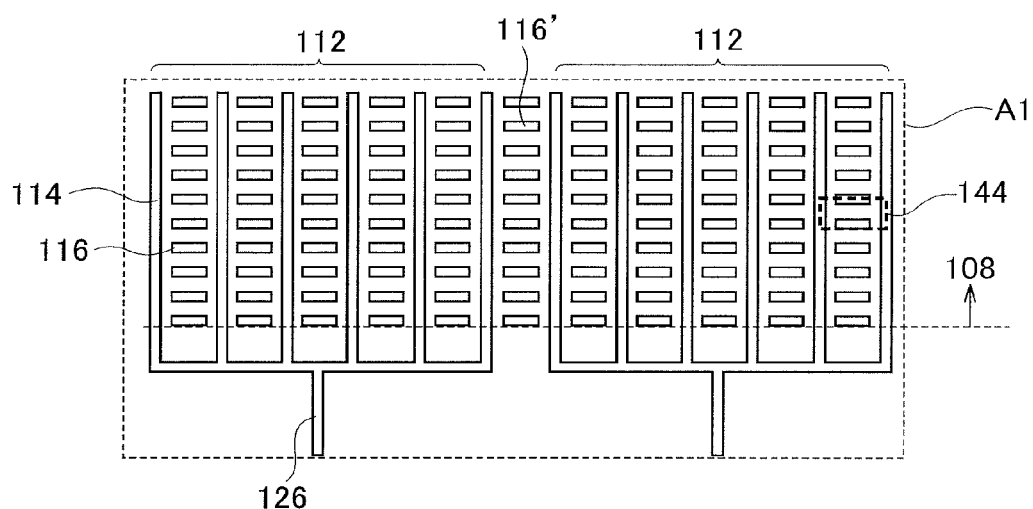
FIG. 2A is a plan view showing a structure of electrodes in a sensing unit of the organic electroluminescent display device in the embodiment according to the present invention.

With reference to FIG. 2A, the first electrode pattern 110 in area A1 enclosed by the dashed line in FIG. 1 will be described in detail. FIG. 2A is an enlarged view of area A1, and is a plan view showing a preferable embodiment of the first electrode pattern 110 (FIG. 1).

The first electrode pattern 110 (FIG. 1) includes a plurality of thin linear first electrodes 114 extending in one direction (e.g., Y direction) at generally an equal interval in the display pixel area 108. Among the plurality of first electrodes 114, optional several, or several tens of, first electrodes 114 are coupled together outside the display pixel area 108, and are electrically connected to each of the first lines 126. For the sake of convenience, a group of the first electrode 114 that are connected to one first line 126 will be referred to as a "first electrode block 112".

The first electrode block 112 includes a plurality of first electrodes 114 arrayed at a predetermined interval. Between adjacent first electrodes 114, first inter-electrode patterns 116 are provided. The first inter-electrode patterns 116 each have a short and linear shape extending in a direction intersecting the one direction (e.g., X direction), and are arrayed in the one direction (Y direction) generally at an equal interval.

The interval between adjacent first electrodes 114 and the interval between adjacent first inter-electrode patterns 116 are optional. Preferably, as shown in FIG. 2A, any two adjacent first electrodes 114 and any two adjacent first inter-electrode patterns 116 are located to enclose a sub pixel 144 in the display pixel area 108. In other words, in the display pixel area 108, it is preferable that sub pixels 144 are located to be each enclosed by two adjacent first electrodes 114 and two adjacent first inter-electrode patterns 116.

The first electrode pattern 110 (FIG. 1) is preferably formed of a non-transmissive conductive material, for example, a metal material such as aluminum (Al), titanium (Ti), molybdenum (Mo), tungsten (W) or the like. In this manner, the first electrode pattern 110 can have a function of a light shielding layer. Namely, the sub pixels 144 are each enclosed by the first electrodes 114 and the first inter-electrode patterns 116, so that light output areas of the sub pixels 144 are demarcated to prevent light from one sub pixel from leaking toward an adjacent sub pixel.

For the sake of convenience, the first electrodes 114 coupled together outside the display pixel area 108 and the first inter-electrode patterns 116 provided between such first electrodes 114 are grouped as the first electrode block 112. A plurality of such first electrode blocks 112 are arrayed at a predetermined interval.

Between any two adjacent first electrode blocks 112, a blank area where no electrode pattern is provided would be present. If such a blank area is provided between two adjacent first electrode blocks 112, display non-uniformity (display lines) may be visually recognized by a user viewing a display screen in an oblique direction in the state where the organic electroluminescent display device exhibits a display function or an input function.

In order to avoid this, in this embodiment, patterns that are the same as the first inter-electrode patterns 116 are located in the blank area. Since the patterns that are the same as the first inter-electrode patterns 116 (dummy patterns) are provided in the blank area, the first electrode pattern 110 (FIG. 1) is guaranteed to have a periodicity and thus the inconvenience that display non-uniformity (display lines) is visually recognized can be solved.

In this embodiment, first inter-electrode patterns 116', which are the dummy patterns, are provided between the first electrode blocks 112. The first inter-electrode patterns 116' each have a cut-off portion at both of two ends thereof so as not to be in contact with the first electrodes 114. Since the first inter-electrode patterns 116' have the cut-off patterns and thus are not in contact with the first electrodes 114, shortcircuit between adjacent blocks, which would be otherwise caused by pattern defect or the like, can be decreased.

Figure 2B:
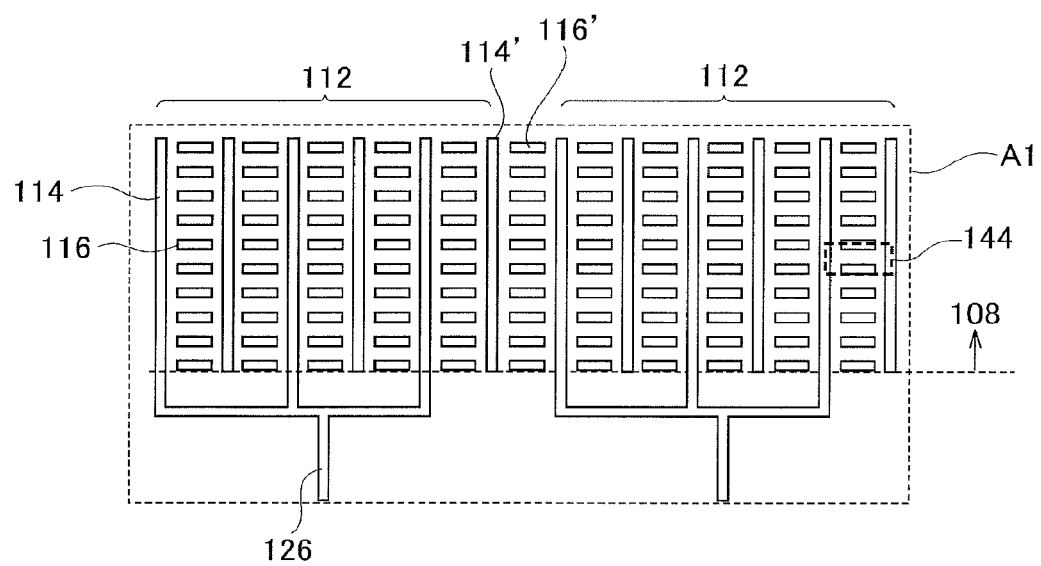
FIG. 2B is a plan view showing a structure of electrodes in the sensing unit of the organic electroluminescent display device in the embodiment according to the present invention.

FIG. 2B shows another preferable embodiment of the first electrode pattern 110 (FIG. 1). In FIG. 2B, the first electrode pattern 110 (FIG. 1) includes the first electrodes 114 and the first inter-electrode patterns 116. The first electrodes 114 and the first inter-electrode patterns 116 have substantially the same structure as that shown in FIG. 2A, except that a smaller number of the first electrodes 114 are coupled together (are connected to each of the first lines 126) outside the display pixel area 108. In the embodiment shown in FIG. 2B, every other first electrode 114 is connected to the first line 126.

In FIG. 2B, it is preferable that dummy patterns, namely, a first electrode 114' and the inter-electrode patterns 116', are provided between adjacent first electrode blocks 112. Namely, it is preferable that the first electrode 114' and/or the first inter-electrode patterns 116' are provided between any two adjacent first electrode blocks 112 such that the first electrode pattern 110 (FIG. 1) has a periodicity. Owing to provision of such dummy patterns, it can be made difficult for the first electrode pattern 110 to be visually recognized.

For the first electrode pattern 110 (FIG. 1) in this embodiment, the number of first electrodes 114 to be connected to the first line 126 in each first electrode block 112 may be optional. The number of electrodes that are actually used for sensing in one electrode block may be adjusted, so that the periodicity of the pattern can be maintained while the value of the electrostatic capacitance can be adjusted. Owing to this, the sensitivity of the sensing unit 106 (FIG. 1) can be adjusted.

(3) Structure of the Module

Figure 3:
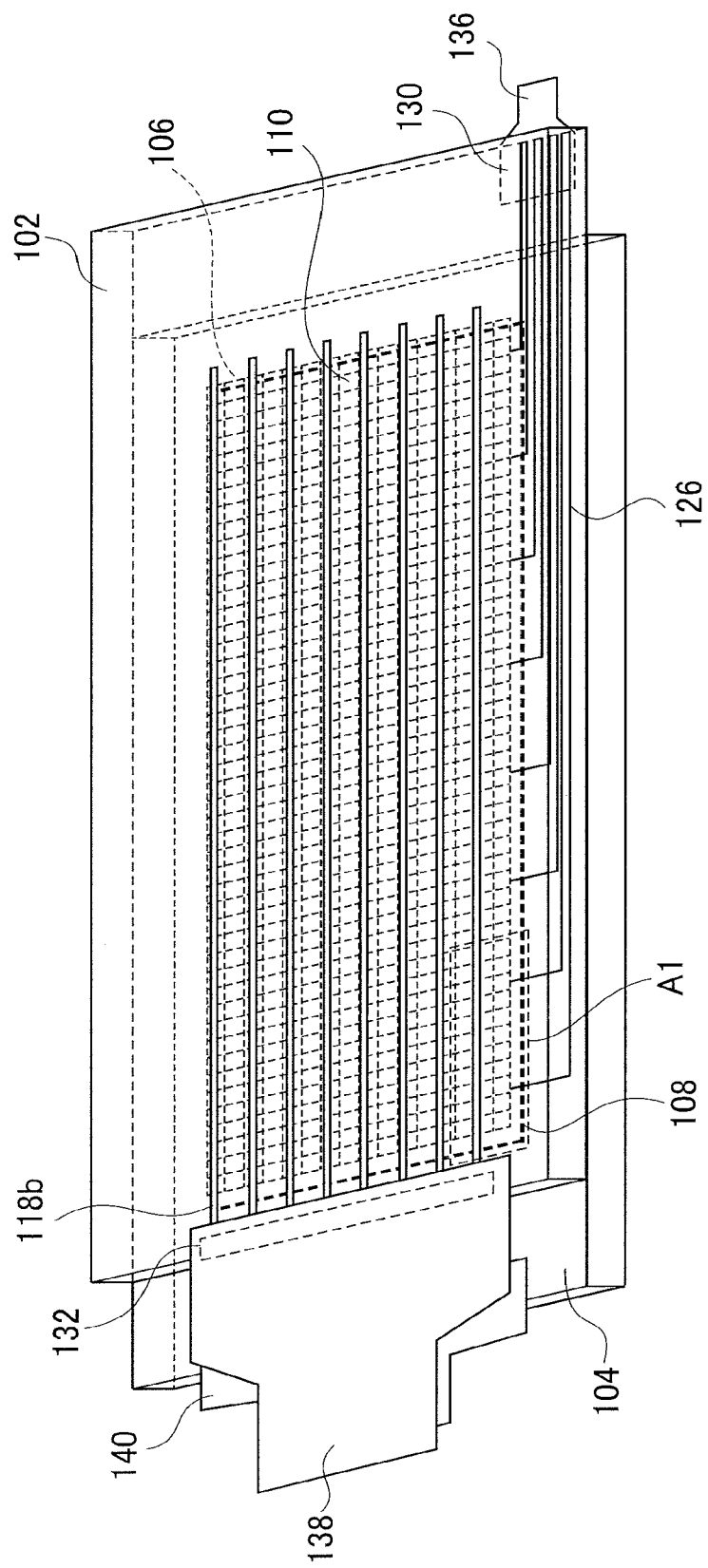
FIG. 3 is a perspective view showing an overview of a module of the organic electroluminescent display device in the embodiment according to the present invention.
Figure 4:
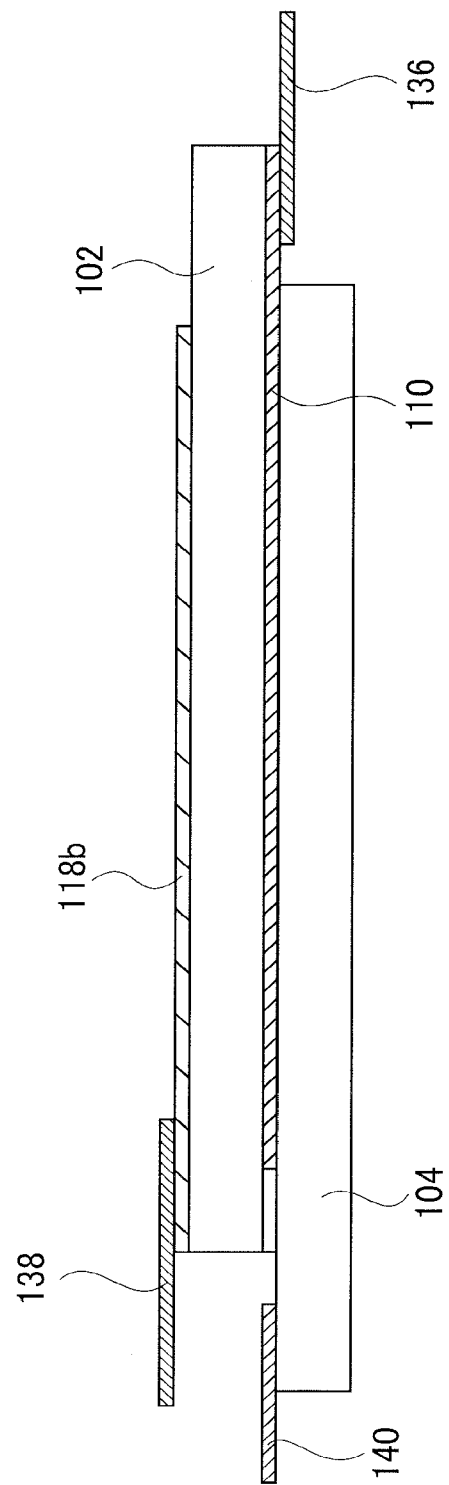
FIG. 4 is a cross-sectional view showing the overview of the module of the organic electroluminescent display device in the embodiment according to the present invention.

FIG. 3 shows an embodiment of a module in which flexible printed circuit boards (hereinafter, referred to as "FPC") are attached to the organic electroluminescent display device shown in FIG. 1. FIG. 4 is a schematic cross-sectional view of the module shown in FIG. 3. Hereinafter, the module will be described with reference to FIG. 3 and FIG. 4.

The sensing unit 106 in the second substrate 102 includes the first electrode pattern 110 and a second electrode pattern 118b. The first electrode pattern 110 is provided at a surface of the second substrate 102 facing the first substrate 104, and the second electrode pattern 118b is provided at a surface of the second substrate 102 opposite to the first electrode pattern 110. The display pixel area 108 is provided to overlap the sensing unit 106. The display pixel area 108 includes the plurality of sub pixels, and the sub pixels emit light toward the second substrate 102. Therefore, the display screen formed of the display pixel area 108 is over the second substrate 102.

A first FPC 136 is connected to the first terminal portion 130 of the second substrate 102 that is connected to the first electrode pattern 110 by the first lines 126. A second FPC 138 is connected to a second terminal portion 132 of the second substrate 102 that is connected to the second electrode pattern 118b. A third FPC 140 is attached to the first substrate 104.

As shown in FIG. 2A or FIG. 2B, the first electrode pattern 110 includes the plurality of first electrode blocks 112. Each of the plurality of first electrode blocks 112 is connected to one first line 126. The plurality of first lines 126 are integrated together and connected to the first terminal portion 130 along the peripheral edge of the second substrate 102. Since the first lines 126 are integrated, the first terminal portion 130 can have a smaller width, and thus the first FPC 136 can be smaller. The second FPC 138 connected to the second electrode pattern 118b has substantially the same width as that of the second electrode pattern 118b and is connected to the second electrode pattern 118b in the second terminal portion 132.

Figure 5:
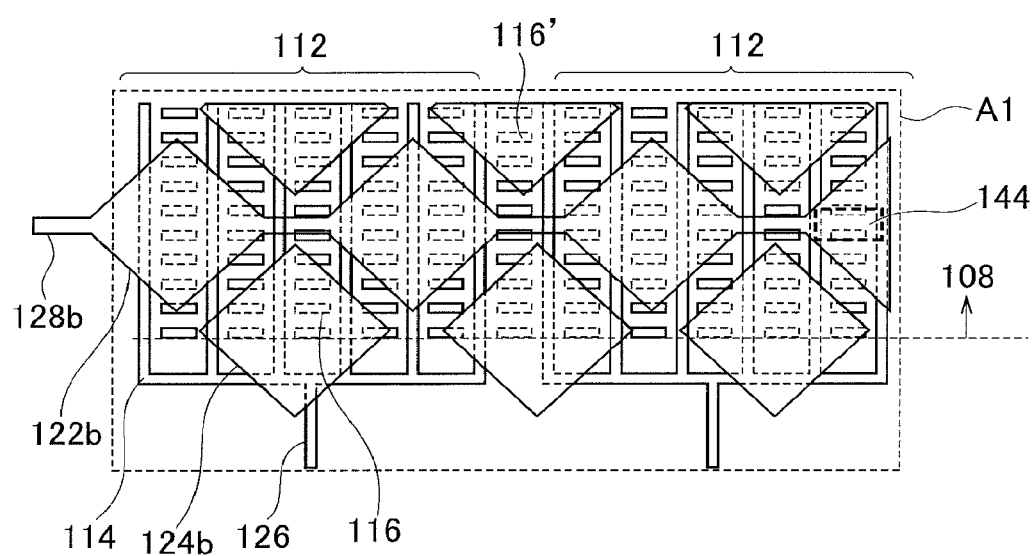
FIG. 5 is a plan view showing a structure of electrodes in the sensing unit of the organic electroluminescent display device in the embodiment according to the present invention.

With reference to FIG. 5, the first electrode pattern 110 in area A1 enclosed by the dashed line and the second electrode pattern 118b that are shown in FIG. 3 will be described in detail. As shown in FIG. 5, the first electrode pattern 110 extends in one direction (Y direction for the sake of convenience in FIG. 5), whereas the second electrode pattern 118b extends in a direction intersecting the one direction (X direction for the sake of convenience in FIG. 5).

FIG. 5 shows a detailed structure of an electrostatic system of the electrode pattern of the sensing unit (FIG. 3). The electrostatic sensor detects a change in the electrostatic capacitance of the first electrode pattern 110 (FIG. 3) and the second electrode pattern 118b (FIG. 3) and thus can detect at which position in the plane the electrostatic capacitance has been changed. For example, the electrostatic sensor detects a change in the Y direction by the first electrode pattern 110 (FIG. 3) and detects a change in the X direction by the second electrode pattern 118b (FIG. 3), and thus can detect which position in the plane of the sensing unit 106 (FIG. 3) has been touched by the user's finger.

The first electrodes 114 and the first inter-electrode patterns 116 included in the first electrode pattern 110 (FIG. 3) enclose the sub pixels 114 as shown in FIG. 2A or FIG. 2B, and are linear and periodically provided generally in accordance with the pitch of the sub pixels 144. By contrast, a plurality of second electrodes 122b in the second electrode pattern 118 (FIG. 3) are planar. A series of such second electrodes 122b, among the plurality of second electrodes 122b, are electrically connected in the X direction via connection portions and connected to a second line 128b. The planar electrodes 122b each have a size that covers a plurality of sub pixels, namely, covers each of periods of the periodical first electrode pattern 110. The first electrodes 114 and the first inter-electrode patterns 116 of the first electrode pattern 110 (FIG. 3) are provided at such a small pattern as to enclose individual pixel electrodes 144. The pitch may be changed in accordance with the size of the display screen and the number of pixels, and is about several hundred micrometers. By contrast, the second electrodes 122b of the second electrode pattern 118b (FIG. 3) may be generally as large as several millimeters because it is merely needed to specify the position of an icon displayed over the display screen.

Light output from the sub pixels 144 is transmitted through the second substrate (FIG. 3). Therefore, it is preferable that the second electrode pattern 118 (FIG. 3) is formed of a transparent conductive material whereas the first electrode pattern 110 (FIG. 3) is formed of a non-transmissive metal material. The transparent conductive material is, for example, indium tin oxide (ITO), a composite material of indium tin oxide and zinc oxide (IZO), or the like.

The first electrodes 114 and the first inter-electrode patterns 116 of the first electrode pattern 110 (FIG. 3) and the second electrodes 122b of the second electrode 118b (FIG. 3) are much smaller than, for example, the finger of the user. Therefore, it is not needed to detect a touch by use of all the electrodes. For example, as shown in FIG. 5, second inter-electrode patterns 124b may be provided on both sides of each second electrode 122b. The second inter-electrode patterns 124b are not electrically connected to the second electrodes 122b and thus do not contribute to sensing, but form a periodical pattern like the second electrodes 122b.

This makes it difficult for the second electrode pattern 118*b* to be visually recognized. Namely, the provision of the second inter-electrode patterns 124*b* contributes to make the second electrode pattern 118*b* externally invisible. By contrast, the pitch of the first electrodes 114 and the first inter-electrode patterns 116 of the first electrode pattern 110 (FIG. 3) are too small to be visually recognized and do not cover the sub pixels 144, and thus do not influence the display.

As described above, the first electrode pattern 110 enclose the sub pixels 144, and the second electrodes 122*b* facing the first electrode pattern 110 each have a large square or rectangular shape. Owing to such a structure, the same sensing function as that of the conventional device can be provided while the light shielding function between adjacent sub pixels is provided by the first electrode pattern 110.

(4) Details of the Display Pixel Area

Figure 6:
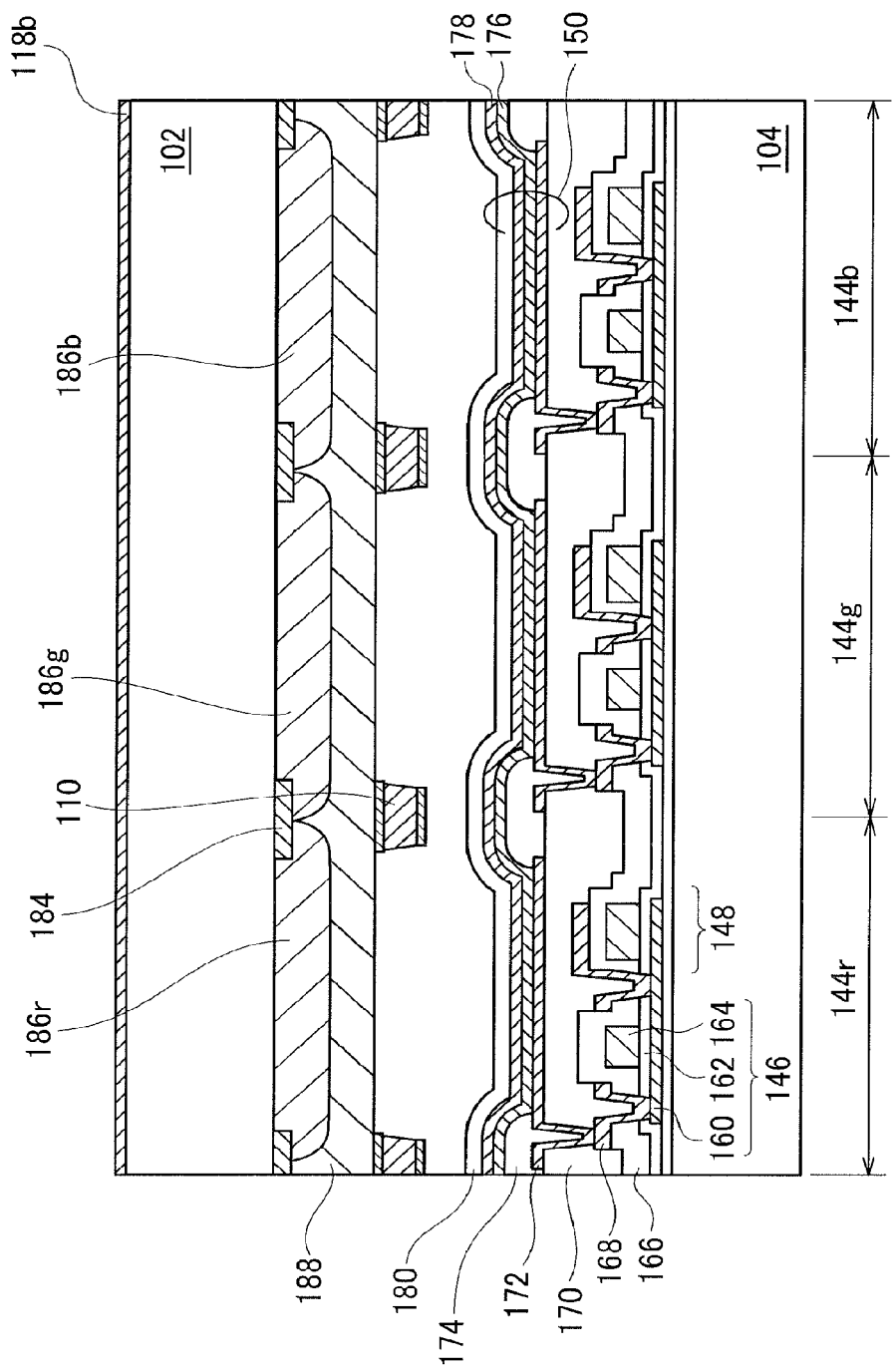
FIG. 6 is a cross-sectional view showing details of a pixel area of the organic electroluminescent display device in the embodiment according to the present invention.

FIG. 6 shows the display pixel area of the organic electroluminescent display device in this embodiment in detail. FIG. 6 shows a cross-sectional structure of a first sub pixel 144*r*, a second sub pixel 144*g* and a third sub pixel 144*b*. The first sub pixel 144*r* is a red sub pixel, the second sub pixel 144*g* is a green sub pixel, and the third sub pixel 144*b* is a blue sub pixel. These sub pixels have basically the same structure.

Each sub pixel includes a transistor 146, a storage capacitance 148 and a light emitting device 150. The transistor 146 includes a semiconductor layer 160, a gate insulating layer 162 and a gate electrode 164. A source or drain electrode 168 is connected to a pixel electrode 172. Between the gate electrode 164 and the source or drain electrode 168, a first interlayer insulating layer 166 is provided. Between the source or drain electrode 168 and the pixel electrode 172, a second interlayer insulating layer 170 is provided. The light emitting device 150 is formed of a stack of the pixel electrode 172, a light emitting layer 176 and a counter electrode 178. The light emitting layer 176 contains an organic electroluminescence material.

Over the first substrate 104, a partition layer 174 is provided to demarcate the sub pixels 144. A passivation layer 180 is provided over the counter electrode 178 and protects the light electrode device 150 against deterioration due to moisture or the like. Over the second substrate 102, the first electrode pattern 110 is provided at the surface thereof facing the first substrate 102. Over the opposite surface of the second substrate 102, the second electrode pattern 118*b* is provided. The first substrate 102 and the second substrate 104 face each other while having a gap therebetween. The gap may be filled with a filling material.

Over the second substrate 102, a color filter layer 186*r* that transmits red light, a color filter layer 186*g* that transmits green light and a color filter layer 186*b* that transmits blue light are provided in correspondence with the first sub pixel 144*r*, the second sub pixel 144*g* and the third sub pixel 144*b*. In the case where the color filter layers are provided over the second substrate 102, it is not necessary that the light emitting devices 150 for the first sub pixel 144*r*, the second sub pixel 144*g* and the third sub pixel 144*b* emit light of different spectra from each other. The light emitting devices 150 provided for the respective sub pixels may emit white light. Owing to this, the light emitting layer 176 do not need to contain different materials in correspondence with the first sub pixel 144*r*, the second sub pixel 144*g* and the third sub pixel 144*b*, and the light emitting layer 176 can be provided commonly for all the sub pixels. This is advantageous to decrease the size of the sub pixels (or pixels). The light emitting layer 176 can emit white light by having a structure including a stack of light emitting layers that respectively emit red (R) light, green (G) light blue (B) light, or a stack of light emitting layers that respectively emit blue (B) light and yellow (Y) light.

A light shielding layer 184 is provided at a border between the color filter layer 186*r* that transmits red light, the color filter layer 186*g* that transmits green light and the color filter layer 186*b* that transmits blue light. An overcoat layer 188 is provided to cover the color filter layer 186*r*, the color filter layer 186*g* and the color filter layer 186*b* in order to flatten the surface.

The first electrode pattern 110 is provided at the surface that is generally flattened by the overcoat layer 188. Since the first electrode pattern 110 is provided on such a flat surface, the electrostatic capacitance is prevented from being deviated part by part in a static state.

As described above, the first electrode pattern 110 is provided so as to enclose the sub pixels 144, and therefore generally overlap the light shielding layer 184. In other words, the partition layer 174 provided over the first substrate 104 is located to enclose the pixel electrodes 172, and therefore the first electrodes 114 and the first inter-electrode patterns 116 of the first electrode pattern 110 are located to be held between the light shielding layer 184 and the partition layer 174. Such an arrangement of the first electrode pattern 110 does not decrease the numerical aperture of the pixels.

As shown in FIG. 6, it is preferable that the first electrode pattern 110 provided over the overcoat layer 188 protrudes toward the first substrate 104. In other words, it is preferable that the first electrode pattern 110 is as close as possible to the light emitting device 150 provided in each sub pixel 144.

Light emitted by the light emitting device 150 is output in a generally vertical direction (toward the second substrate 102 in FIG. 6) and also in an oblique direction. If, for example, among the light output from the second sub pixel 144*g*, an oblique light component is incident over the color filter layer 816*r* or the color filter layer 186*b* corresponding to the first sub pixel 144*r* or the third sub pixel 144*b*, color mixture occurs. This results in decrease in the color reproducibility and also in the contrast.

However, in the structure in which the first electrode pattern 110 is provided so as to enclose each sub pixel 144 so as to prevent the oblique light component from being leaked to an adjacent sub pixel, such an inconvenience can be solved.

In this case, it is preferable that side surfaces of the first electrode pattern 110 is inclined such that an open area in the first electrode pattern 110 is opened toward the first substrate 102 from the second substrate 102. Owing to such a structure, projected areas of the side surfaces of the first electrode pattern 110 are increased as seen from the light emitting devices 150. As a result, the oblique light component from each light emitting device 150 can be blocked by the side surfaces of the first electrode pattern 110 and prevented from leaking to an adjacent sub pixel.

It is also preferable that at least a part of the side surfaces of the first electrode pattern 110 is a light-reflecting surface. As schematically shown in FIG. 6, since a part of the side surfaces of the first electrode pattern 110 is a light-reflecting surface, the oblique light component from a sub pixel can be reflected by the light-reflecting surface and used as light output from this sub pixel. Since the oblique light component is included in the light output from this sub pixel, the light emitted from the light emitting device 150 can be effectively utilized. Since the first electrode pattern 110 enclosing the sub pixels 144 is formed of a light-reflective metal material, the side surface also acts as a light-reflecting surface, which effectively utilize light emitted from the sub pixel and also prevents light from leaking to an adjacent sub pixel.

In order to exhibit a function as an electrode, a function as a light shielding wall and also a function as a light-reflecting surface, the first electrode pattern 110 preferably includes an aluminum layer or an aluminum alloy layer. In this case, in order to form the first electrode pattern 110 having an inclining light-reflecting surface, the aluminum layer or the aluminum alloy layer may be taper-etched. Aluminum or an aluminum alloy has a low resistance, and therefore does not decrease the response speed when used for an electrode for sensing. Aluminum or an aluminum alloy also has a higher reflectance for light in a visible range than that of titanium or molybdenum, and therefore is preferable for forming a light-reflecting surface. The first electrode pattern 110 may be formed of an aluminum or aluminum alloy single layer, but it is preferable that the aluminum or aluminum alloy single layer is sandwiched between metal layers of titanium or the like having a relatively low light reflectance in order to decrease the amount of stray light.

As described above, in this embodiment, the first electrode pattern is provided so as to enclose the sub pixels, and thus the inter-pixel (inter-sub pixel) color mixture can be prevented. This can improve the image quality. This structure can also increase the light extraction efficiency of light from the light emitting device in each pixel. This can decrease the power consumption.

Even in the case where the first electrode pattern is a precise pattern enclosing the sub pixels, the number of lines usable as detection lines may be appropriately adjusted, so that the electrostatic capacitance of the sensing electrodes can be adjusted and thus the sensitivity of the sensing electrodes can be adjusted. This can increase the S/N ratio of a touch sensor unit.

Modification Example 1

Figure 7A:
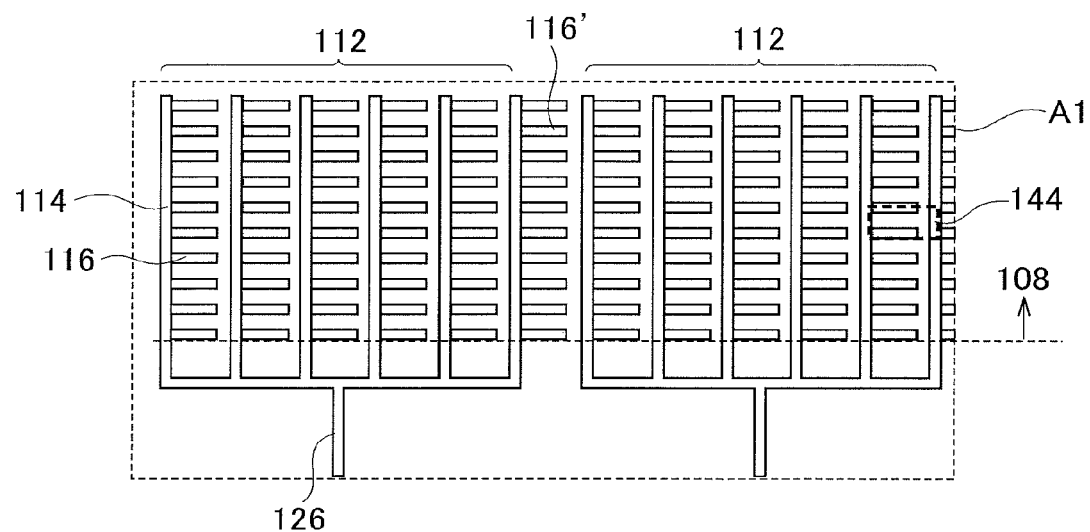
FIG. 7A is a plan view showing a structure of electrodes in a sensing unit of an organic electroluminescent display device in an embodiment according to the present invention.
Figure 7B:
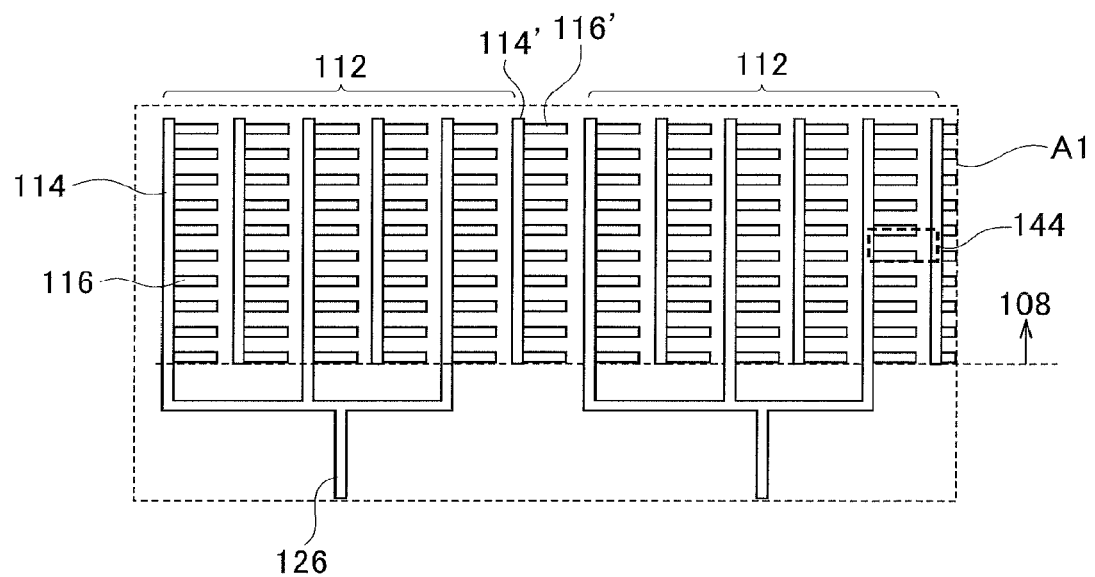
FIG. 7B is a plan view showing a structure of electrodes in a sensing unit of an organic electroluminescent display device in an embodiment according to the present invention.

FIG. 7A and FIG. 7B each show another preferable embodiment of the first electrode pattern 110. In FIG. 7A, the first electrode pattern 110 (FIG. 3) includes the first electrodes 114 and the first inter-electrode patterns 116 in the display pixel area 108. The first electrodes 114 extend in one direction (Y direction for the sake of convenience in FIG. 7A), whereas the first inter-electrode patterns 116 extend in a direction intersecting the one direction (X direction for the sake of convenience in FIG. 7A). The first inter-electrode patterns 116 each have a cut-off portion at an end thereof, and is connected to the first electrode pattern 110 at the other end thereof.

In FIG. 7B, the first electrodes 114 and the first inter-electrode patterns 116 of the first electrode pattern 110 (FIG. 3) have substantially the same structure as that in FIG. 7A, except that a smaller number of the first electrodes 114 are coupled together (are connected to each of the first lines 126) outside the display pixel area 108. In the embodiment shown in FIG. 7B, every other first electrode 114 is connected to the first line 126.

Owing to such a structure, the value of the electrostatic capacitance of the first electrode pattern 110 (FIG. 3) can be adjusted, and thus the sensitivity of the sensing unit can be adjusted. In this case, it is preferable that dummy patterns are provided between adjacent first electrode blocks 112 so that display non-uniformly (display lines) is not visually recognized. In FIG. 7A, the first inter-electrode patterns 116' are provided between adjacent first electrode blocks 112. In FIG. 7B, the first electrode 114' and the first inter-electrode pattern 116' are provided between adjacent first electrode blocks 112. Owing to provision of such dummy patterns, the first electrode pattern 110 is guaranteed to have a periodicity, and display non-uniformity (display lines), which could otherwise occur when a viewer views the display screen in an oblique direction, can be suppressed.

In FIG. 7A and FIG. 7B, the first electrodes 114 and the first inter-electrode patterns 116 enclose the sub pixels 144. The present invention is not limited to such a structure. The first electrodes 114 and the first inter-electrode patterns 116 may enclose pixels (display unit formed of a plurality of sub pixels).

Figure 8:
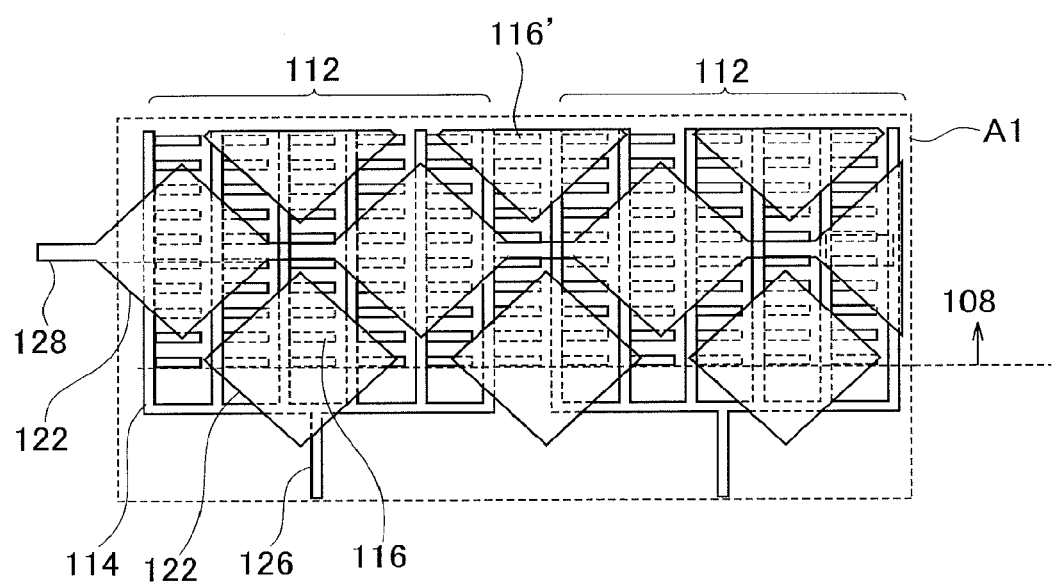
FIG. 8 is a plan view showing a structure of electrodes in a sensing unit of an organic electroluminescent display device in an embodiment according to the present invention.

FIG. 8 shows a detailed structure of the first electrode pattern 110 (FIG. 3) and the second electrode pattern 118*b* (FIG. 3) shown in FIG. 7A. In FIG. 8, the first electrodes 114 of the first electrode pattern 110 (FIG. 3) extend in one direction (Y direction for the sake of convenience in FIG. 8), whereas the second electrode pattern 118*b* (FIG. 3) extends in a direction intersecting the one direction (X direction for the sake of convenience in FIG. 8). The second electrode pattern 118*b* (FIG. 3) have substantially the same structure as that described above with reference to FIG. 5.

With the first electrode pattern 110 (FIG. 3) shown in FIG. 7A or FIG. 7B, a region of the first electrode pattern 110 that encloses each sub pixel 144 has only two cut-off portions. This can reinforce the function as the light shielding wall and/or the light-reflecting surface between adjacent sub pixels. Therefore, the problem of the color mixture between adjacent sub pixels can be solved. As a result, the utilization factor of the light emitted by the light emitting devices can be further increased, and the contrast and also the visual recognizability can be further improved.

Embodiment 2

In this embodiment, an organic electroluminescent display device having an input function in which the resistance of electrodes included in a sensing unit is decreased will be described.

(1) Organic Electroluminescent Display Device

Figure 9:
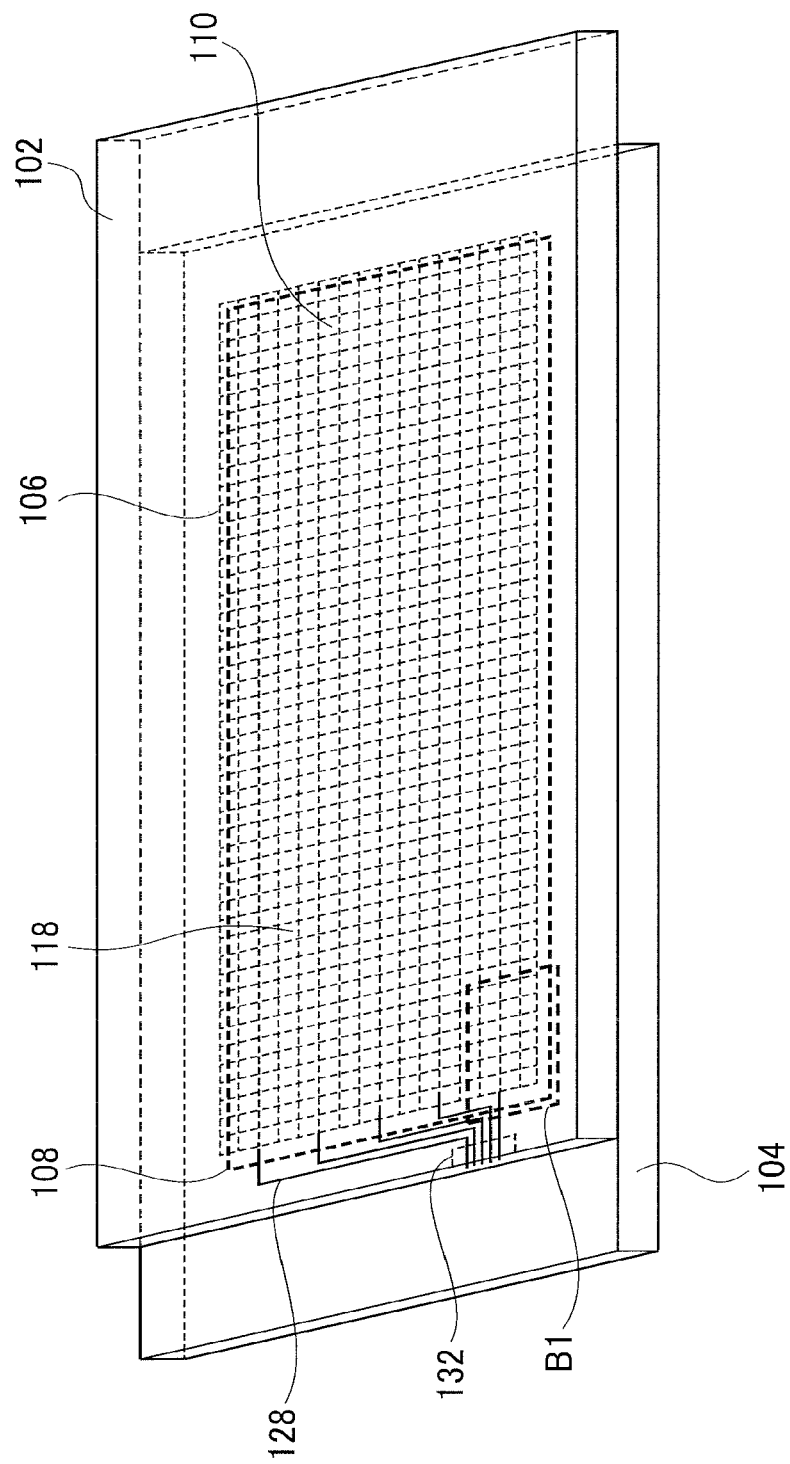
FIG. 9 is a perspective view showing an overview of an organic electroluminescent display device in an embodiment according to the present invention.

FIG. 9 shows a structure of a second electrode pattern 118 in the sensing unit 106 of an organic electroluminescent display device in this embodiment. The second electrode pattern 118 is provided at a surface of the second substrate opposite to the first substrate 104. The first electrode pattern 110 is substantially the same as that in Embodiment 1, and is omitted in FIG. 9.

The second electrode pattern 118 is connected to second lines 128. The second lines 128 are each a metal line, and are integrated together and connected to a second terminal portion 132 provided in an end area of the second substrate 102. Since the second electrode pattern 118 and the second terminal portion 132 are connected to each other by the second lines 128, the second terminal portion 132 can have a smaller width.

(2) Electrode Pattern in the Sensing Unit

Figure 10A:
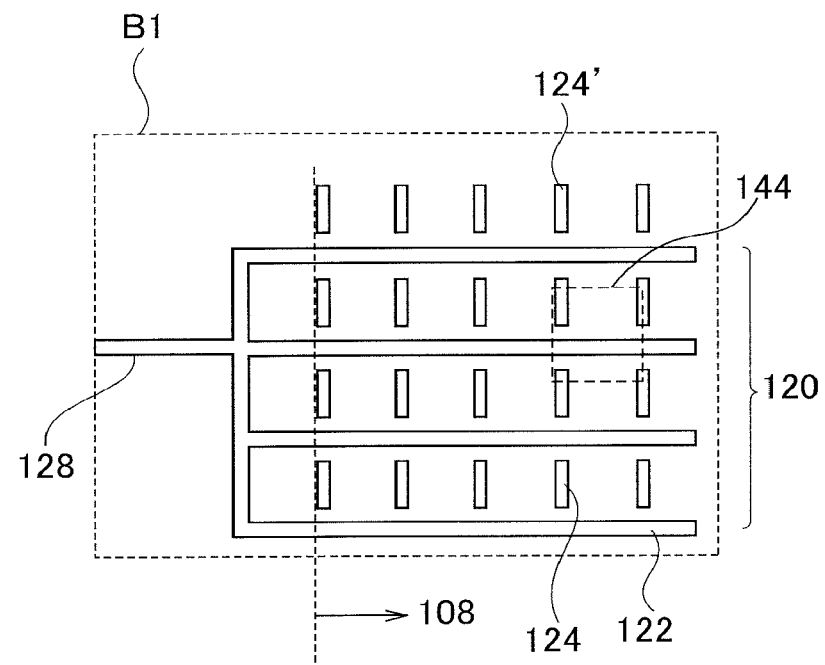
FIG. 10A is a plan view showing a structure of electrodes in a sensing unit of the organic electroluminescent display device in the embodiment according to the present invention.

With reference to FIG. 10A, the second electrode pattern 118 in area B1 enclosed by the dashed line in FIG. 9 will be described in detail. FIG. 10A is a partial enlarged view of the second electrode pattern 118.

FIG. 10A shows a preferable embodiment of the second electrode pattern 118 (FIG. 9). The second electrode pattern 118 (FIG. 9) includes a plurality of thin linear second electrodes 122 extending in one direction (X direction for the sake of convenience in FIG. 10A) and arrayed in the Y direction at generally an equal interval in the display pixel area 108. Among the plurality of second electrodes 122, a group of second electrodes 122 are coupled together outside the display pixel area 108 and are electrically connected to each of the second lines 128.

Between adjacent second electrodes 122, second inter-electrode patterns 124 are provided. The second inter-electrode patterns 124 each have a short and linear shape extending in a direction intersecting the one direction (Y direction for the sake of convenience in FIG. 10A) and are arrayed in the X direction generally at an equal interval.

The interval between adjacent second electrodes 122 and the interval between adjacent second inter-electrode patterns 124 of the second electrode pattern (FIG. 9) are optional. Preferably, as shown in FIG. 10A, any two adjacent second electrodes 122 and any two adjacent second inter-electrode patterns 124 are provided so as to enclose a sub pixel 144 in the display pixel area 108. In other words, it is preferable that sub pixels 144 are provided so as to each enclosed by two adjacent second electrodes 122 and two adjacent second inter-electrode patterns 124.

For the sake of convenience, the second electrodes 122 coupled together outside the display pixel area 108 and the second inter-electrode patterns 124 provided between such second electrodes 122 are grouped as a second electrode block 120. A plurality of such second electrode blocks 120 are arrayed at a predetermined interval in the sensing unit 106 (FIG. 9). Since the second electrode blocks 120 are located at the predetermined interval, there is a blank area between any two adjacent second electrode blocks 120.

If such a blank area is provided in a separation area between two adjacent second electrode blocks 120 (inter-block area), display non-uniformity (display lines) is visually recognized by a user viewing a display screen in an oblique direction in the state where the organic electroluminescent display device exhibits a display function or an input function. However, in the case where patterns that are the same as the second inter-electrode patterns 124 (dummy patterns) are provided in the inter-block area, such an inconvenience can be solved.

Second inter-electrode patterns 124 provided between adjacent second electrode blocks 120 each have a cut-off portion at both of two ends thereof so as not to be in contact with the second electrodes 122. Owing to this, shortcircuit between adjacent blocks, which would be otherwise caused by pattern defect or the like, can be decreased.

The second electrode pattern 118 (FIG. 9) is formed of a metal material. The second electrode pattern 118 (FIG. 9) is located over the viewing side of the display screen, and therefore is preferably formed of a conductive material having a low light reflectance. As a conductive material having a low light reflectance, a metal material such as, for example, titanium (Ti), tungsten (W), molybdenum (Mo) or the like is usable.

In the case where the second electrode pattern 118 (FIG. 9) is formed of a conductive material, for example, a metal material as described above, the second lines 128 that connect the second electrode pattern 118 (FIG. 9) to the second terminal portion 132 can also formed in the same layer.

Figure 10B:
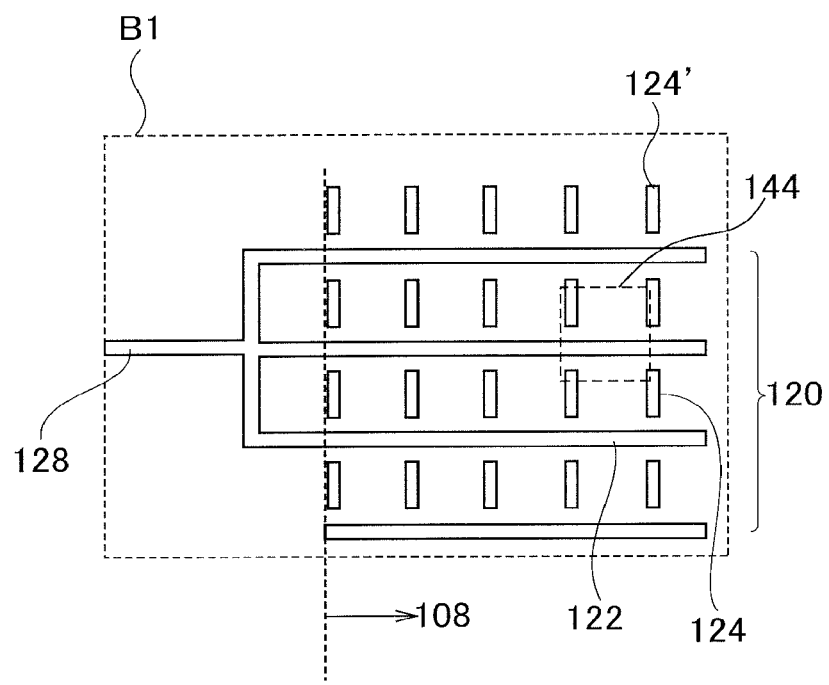
FIG. 10B is a plan view showing a structure of electrodes in a sensing unit of the organic electroluminescent display device in the embodiment according to the present invention.

FIG. 10B shows another preferable embodiment of the second electrode pattern 122 (FIG. 9). In FIG. 18B, the second electrodes 122 and the second inter-electrode patterns 124 of the second electrode pattern 118 have substantially the same structure as that in FIG. 10A, except that a smaller number of the second electrodes 122 are coupled together and connected to each of the second lines 128 outside the display pixel area 108. In the embodiment shown in FIG. 10B, the number of the second electrodes 122 coupled together is less than the number of the second electrodes 122 coupled together in FIG. 10A by one.

For the second electrode pattern 118 (FIG. 9) in this embodiment, the number of second electrodes 122 to be connected to the second line 128 in each second electrode block 120 may be optional. Owing to this, the value of the electrostatic capacitance of the second electrode pattern 118 (FIG. 9) can be adjusted, and thus the sensitivity of the sensing unit can be adjusted. In this case also, it is preferable that the dummy patterns are provided between adjacent second electrode blocks 120.

(3) Structure of the Module

Figure 11:
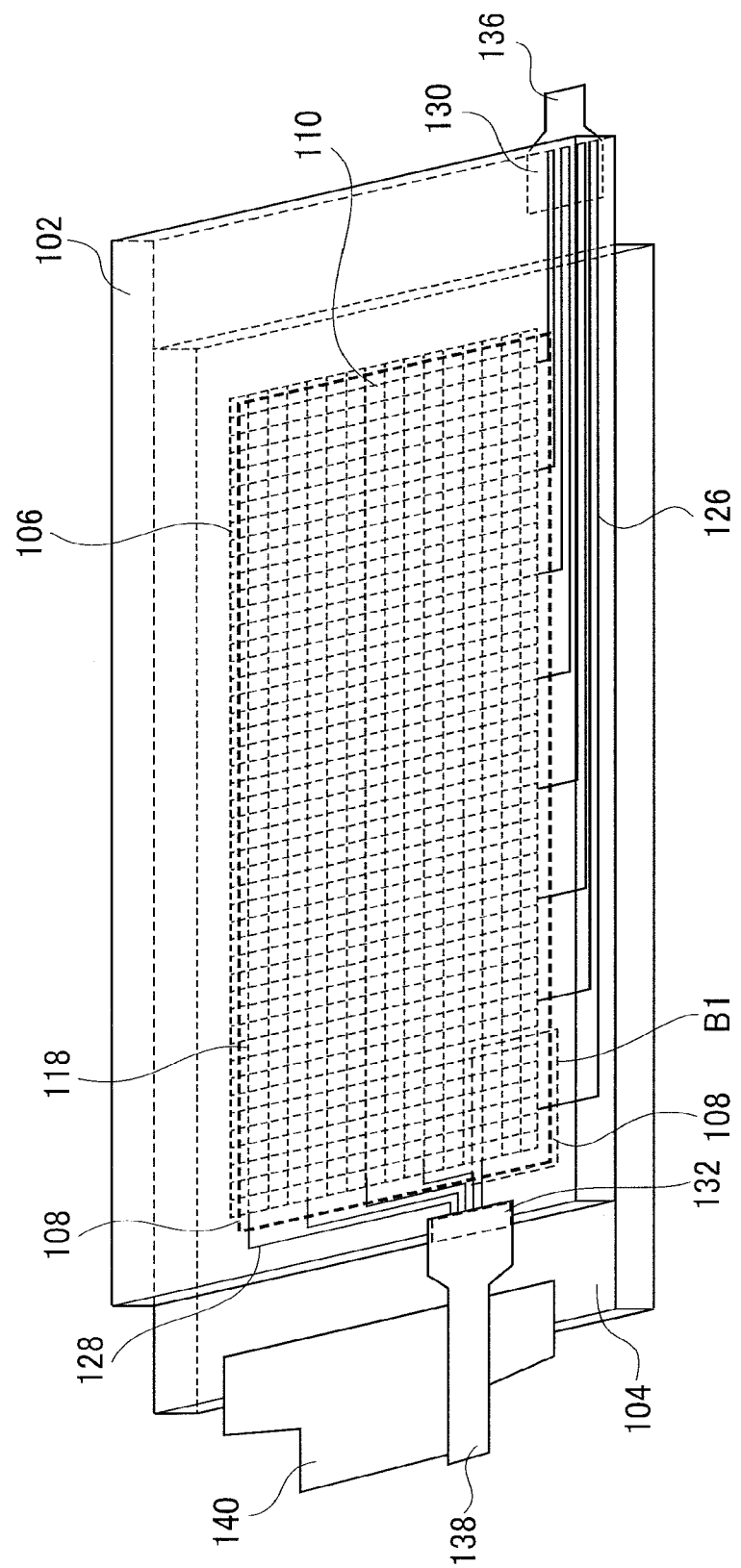
FIG. 11 is a perspective view showing an overview of a module of the organic electroluminescent display device in the embodiment according to the present invention.
Figure 12:
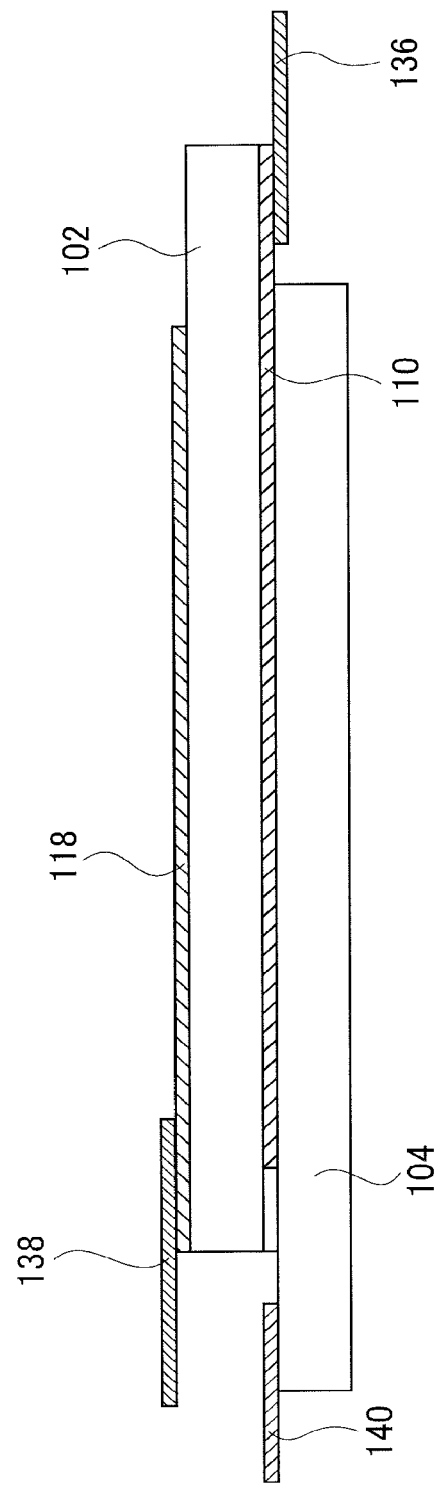
FIG. 12 is a cross-sectional view showing the overview of the module of the organic electroluminescent display device in the embodiment according to the present invention.

FIG. 11 shows an embodiment of a module in which FPCs are attached to the organic electroluminescent display device in this embodiment. FIG. 12 is a schematic cross-sectional view of the module shown in FIG. 11. Hereinafter, the module will be described with reference to FIG. 11 and FIG. 12.

FIG. 11 shows a structure in which the first electrode pattern 110 and the second electrode pattern 118 are provided in the second substrate 104. The first electrode pattern 110 is provided at a surface of the second substrate 102 facing the first substrate 104, and the second electrode pattern 118 is provided at a surface of the second substrate 102 opposite to the first electrode pattern 110.

The first FPC 136 is connected to the first terminal portion 130 of the second substrate 102 that is connected to the first electrode pattern 110 by the first lines 126. The second FPC 138 is connected to the second terminal portion 132 of the second substrate 102 that is connected to the second electrode pattern 118. The third FPC 140 is attached to the first substrate 104.

The second electrode pattern 118 is formed of a conductive material, for example, a metal material having a lower resistance than that of a transparent conductive member such as indium tin oxide (ITO), a composite material of indium tin oxide and zinc oxide (IZO), or the like. Owing to this, the resistance of the second lines 128 connected to the second terminal portion 132 can be also made low. Since the second lines 128 are formed of a metal material, the second lines 128 can be made precise and integrated together. This can decrease the width of the second terminal portion 132. Since the width of the second terminal portion 132 is decreased, the second FPC 138 can be reduced in size.

The second FPC 138 and the third FPC 140 are attached to the same side of the panel as each other. Therefore, in the case where the second FPC 138 is reduced in size, these two FPCs are prevented from interfering with each other when this module is incorporated into a device. Namely, this module can be attached to a small space, which can reduce the size of the device including the module.

Since the second electrode pattern 118 is formed of a conductive material having a lower resistance that that of a transparent conductive material such as indium tin oxide (ITO) or the like, the resistance of the second electrode pattern 118 can be made low. The sensing unit 106 functions by detecting a change in the electrostatic capacitance. Therefore, the reduction in the resistance of the second electrode pattern 118 can increase the response speed. Even when the organic electroluminescent display device is made large (even when the screen of the organic electroluminescent display device is made large), the response speed of the sensing unit 106 can be prevented from being decreased. In the structure in which the second electrode pattern 118 extends in a longitudinal direction of the panel as shown in FIG. 11, the effect provided by the reduction in the resistance of the second electrode pattern 118 is more conspicuous.

Figure 13:
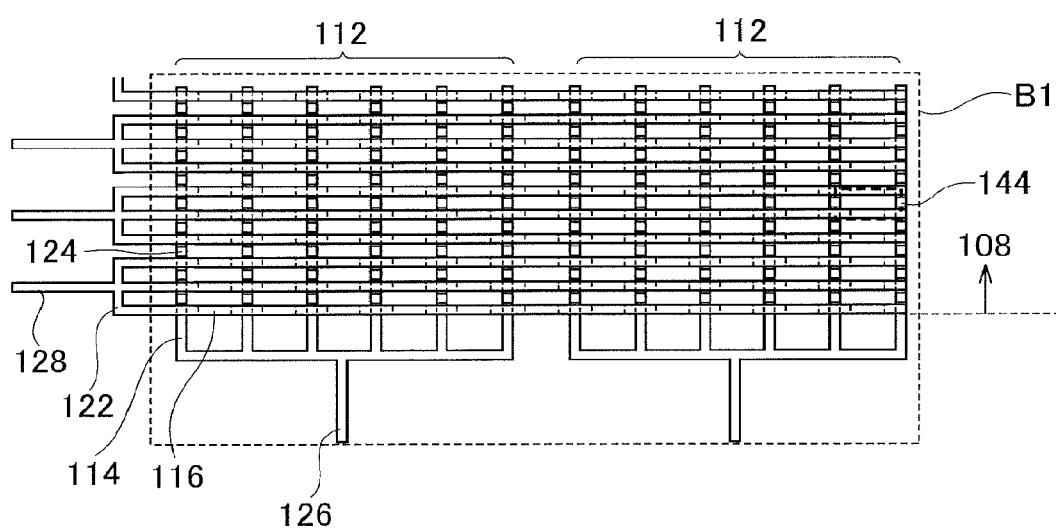
FIG. 13 is a plan view showing a structure of electrodes in the sensing unit of the organic electroluminescent display device in the embodiment according to the present invention.

With reference to FIG. 13, the first electrode pattern 110 in area B1 enclosed by the dashed line and the second electrode pattern 118 that are shown in FIG. 11 will be described in detail. As shown in FIG. 13, the first electrodes 114 of the first electrode pattern 110 extend in one direction (Y direction for the sake of convenience in FIG. 13), whereas the second electrodes 122 of the second electrode pattern 118 extend in a direction intersecting the one direction (X direction for the sake of convenience in FIG. 13).

The first electrode pattern 110 and the second electrode pattern 118 are both provided so as to enclose the sub pixels 114. Therefore, even if the first electrode pattern 110 and the second electrode pattern 118 have a cut-off portion, the sub pixels 144 can be enclosed with no cut-off portion by locating the first electrode pattern 110 and the second electrode pattern 118 to overlap each other in a generally aligned manner. This can increase the inter-pixel (inter-sub pixel) light shielding property.

In FIG. 13, the first electrode pattern 110 (FIG. 11) and the second electrode pattern 118 (FIG. 11) both enclose the sub pixels 114. The present invention is not limited to such a structure. The first electrode pattern 110 (FIG. 11) and the second electrode pattern 118 (FIG. 11) may enclose pixels (display unit formed of a plurality of sub pixels).

(4) Details of the Display Pixel Area

Figure 14:
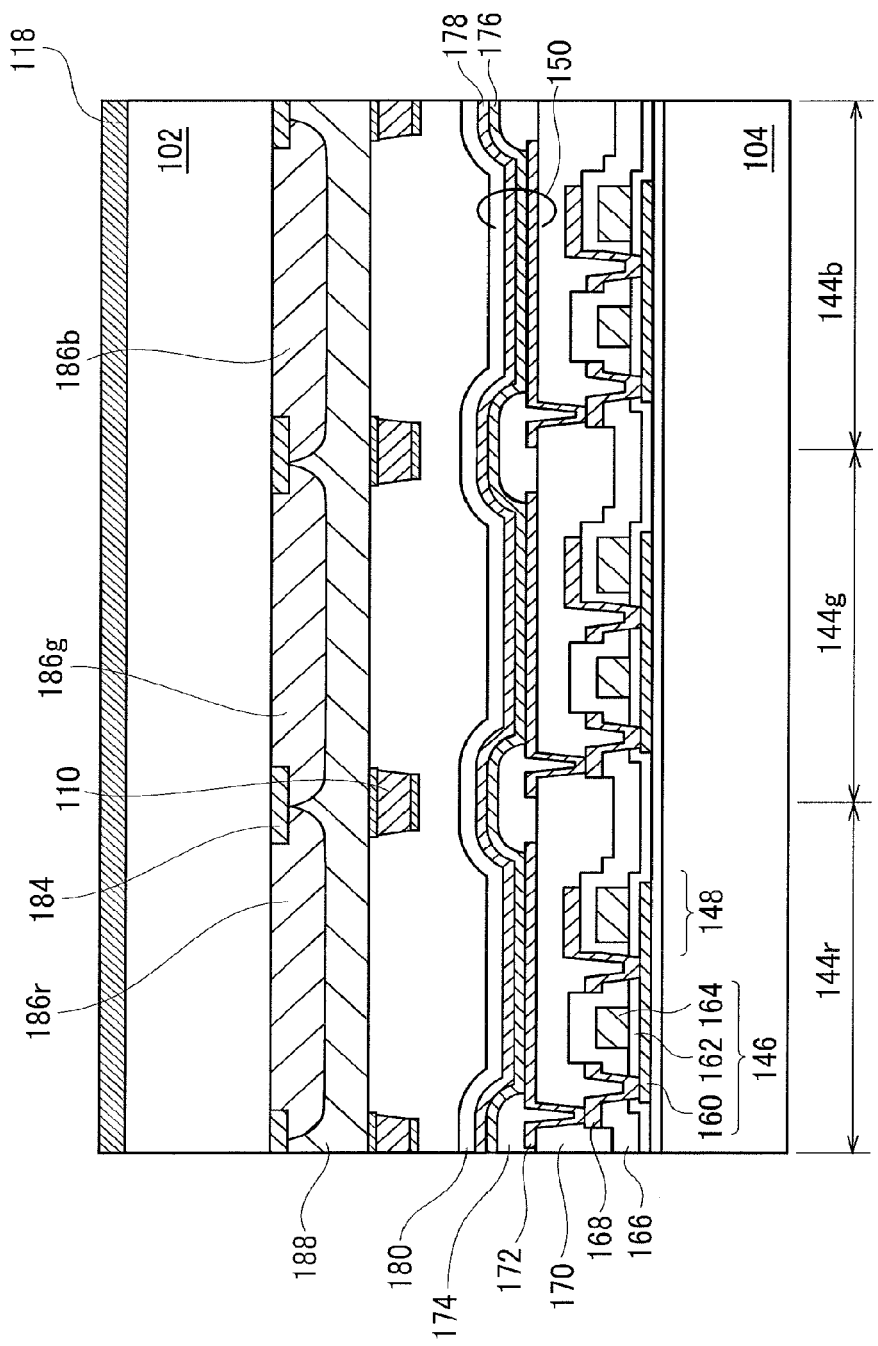
FIG. 14 is a cross-sectional view showing details of a pixel area of the organic electroluminescent display device in the embodiment according to the present invention.

With reference to FIG. 14, a structure of the pixel area of the organic electroluminescent display device in this embodiment will be described. The structure of the first substrate 104 is the same as that described above with reference to FIG. 6 in Embodiment 1 and will not be described again.

Over the second substrate 102, the first electrode pattern 110 is provided over an outer surface of the overcoat layer 188. The first electrode pattern 110 is provided to overlap the light shielding layer 184 and/or the partition layer 174 so as to enclose the sub pixels 144. In other words, the first electrode pattern 110 is located to be held between the light shielding layer 184 and/or the partition layer 174. In FIG. 14, the first electrode pattern 110 (the first electrodes 114) extends in a direction perpendicular to the plane of the paper sheet of FIG. 14.

The second electrode pattern 118 is provided at the surface of the second substrate 102 opposite to the first electrode pattern 110. The second electrode pattern 118 (the second electrodes 122) extend in a direction intersecting the first electrode pattern 110.

The second electrode pattern 118 is located over a visually recognizable plane of the display screen. In this case, the second electrode pattern 118 may be formed of a metal material as described above, so that the reflectance can be decreased and background reflection over the display screen can be decreased. It is preferable that the second electrode pattern 118 is formed of a metal material such as, for example, titanium (Ti), tungsten (W), molybdenum (Mo) or the like as a conductive material having a low reflectance.

Figure 15:
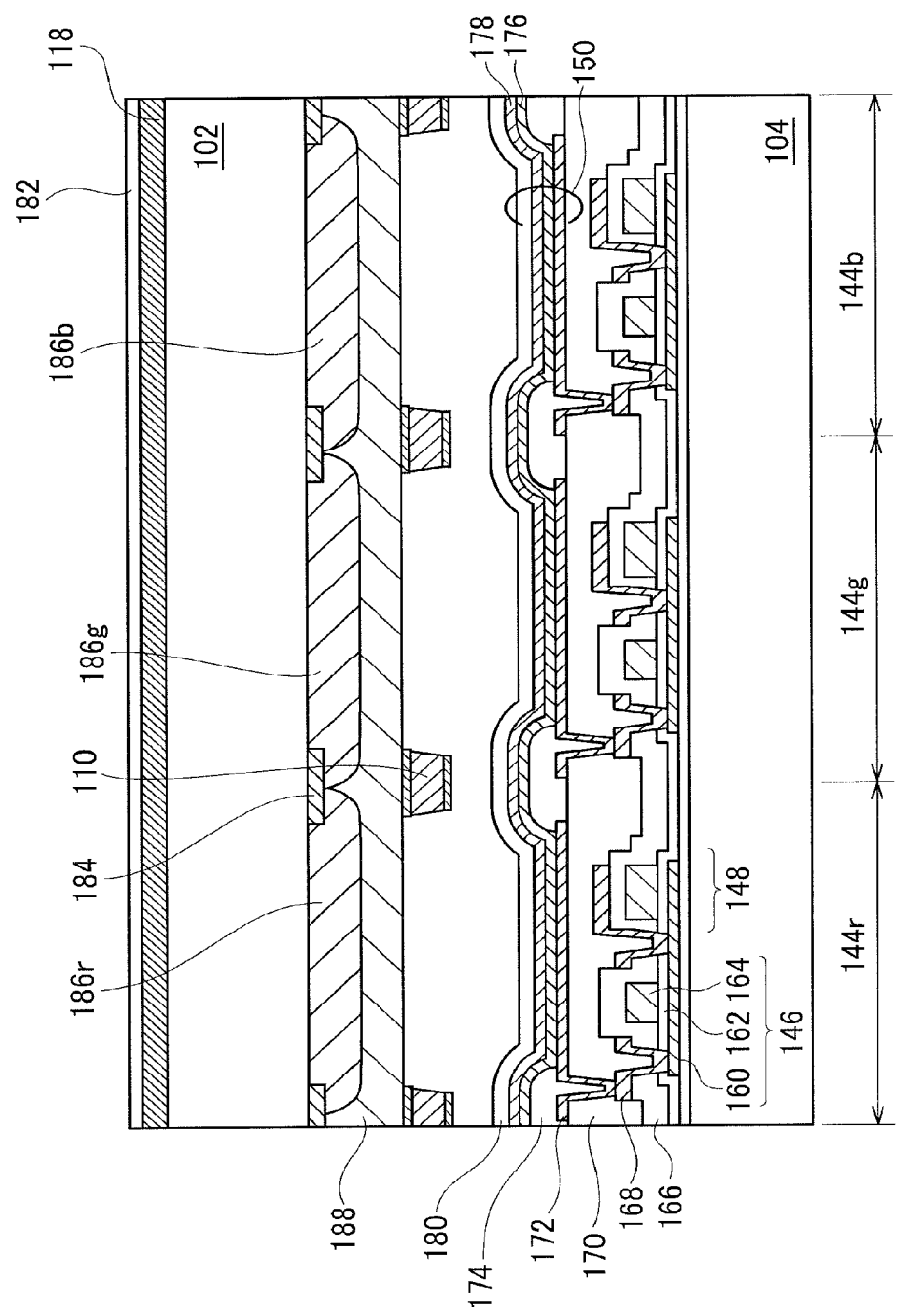
FIG. 15 is a cross-sectional view showing details of a pixel area of the organic electroluminescent display device in the embodiment according to the present invention.

FIG. 15 shows a structure including a protection film 182 provided over the second electrode pattern 118 in addition to the structure shown in FIG. 14. The protection film 182 is preferably provided generally over the entire surface of the second substrate 102 so as to cover the second electrode pattern 118 except for the second terminal portion 132. Since the protection film 182 is provided over the second electrode pattern 182, the effects of protecting the second electrode pattern 118 against corrosion, scratches or the like can be provided. The protection film 182 is preferably formed of an insulating material such as silicon oxide, silicon nitride or the like. The protection film 182 may include a plurality of films having different refractive indices to act as a reflection preventive film.

As described above, in this embodiment, the second electrode pattern is formed of a conductive material having a low resistance, and thus the resistance of the electrodes included in the sensing unit can be decreased. This can increase the response speed of the sensing unit. In other words, even when the organic electroluminescent display device is made large (even when the display screen of the organic electroluminescent display device is made large), the response speed of the sensing unit 106 is prevented from being decreased.

Even in the case where the second electrode pattern is a precise pattern enclosing the sub pixels, the number of lines usable as detection lines may be appropriately adjusted, so that the electrostatic capacitance of the sensing electrodes can be adjusted and thus the sensitivity of the sensing electrodes can be adjusted. This can increase the S/N ratio of a touch sensor unit.

In this embodiment, the second electrode pattern is provided so as to enclose the sub pixels like the first electrode pattern. Therefore, light leaks are prevented, and image quality deterioration, which would be caused by the inter-sub pixel color mixture, can be prevented.

Modification Example 2

Figure 16A:
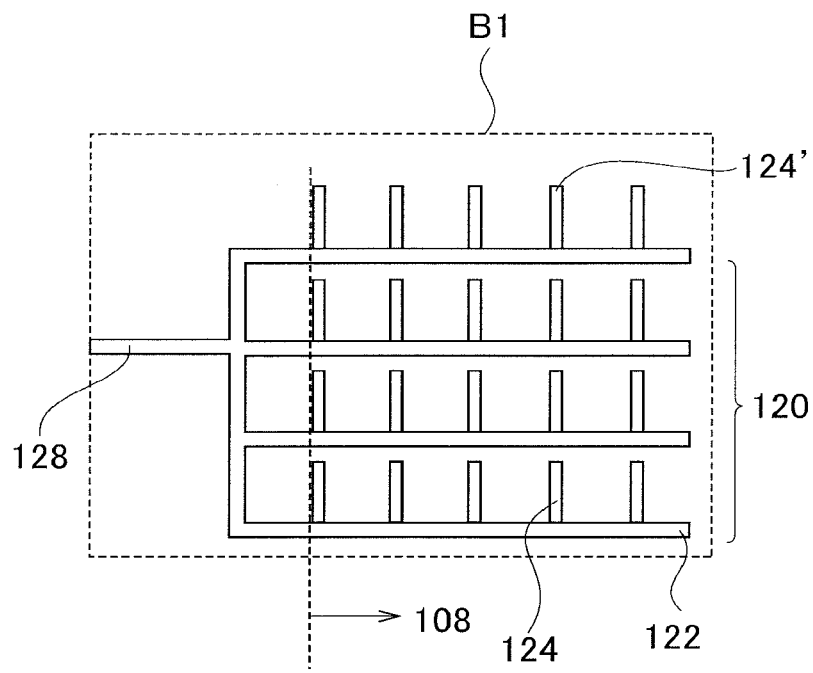
FIG. 16A is a plan view showing a structure of electrodes in a sensing unit of an organic electroluminescent display device in an embodiment according to the present invention.
Figure 16B:
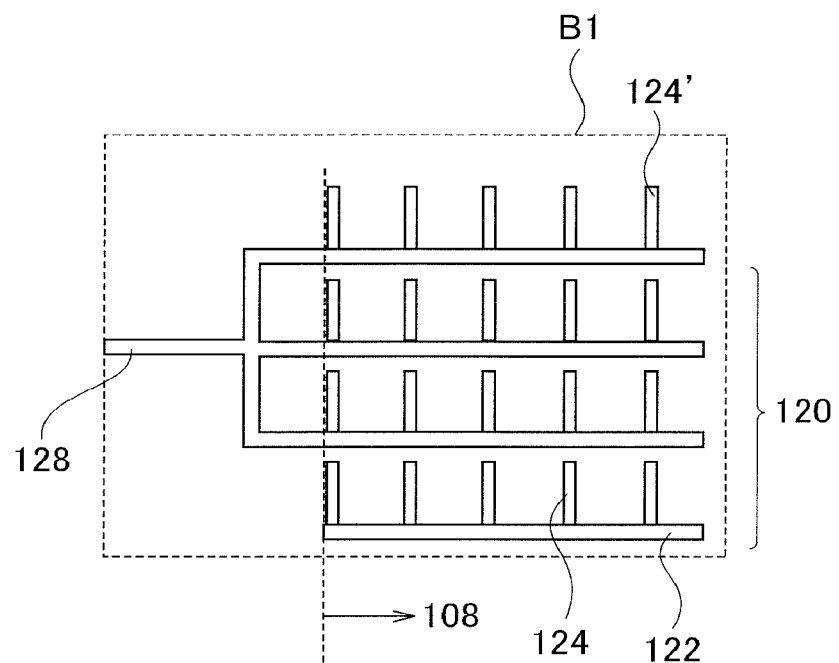
FIG. 16B is a plan view showing a structure of electrodes in a sensing unit of an organic electroluminescent display device in an embodiment according to the present invention.

FIG. 16A and FIG. 16B each show another preferable embodiment of the second electrode pattern 118 (FIG. 11). In FIG. 16A, the second electrode pattern 118 (FIG. 11) includes the second electrodes 122 and the second inter-electrode patterns 124 in the display pixel area 108. The second electrodes 122 extend in one direction (X direction for the sake of convenience in FIG. 16A), whereas the second inter-electrode patterns 124 extend in a direction intersecting the one direction (Y direction for the sake of convenience in FIG. 16A). The second inter-electrode patterns 124 each have a cut-off portion at an end thereof, and is connected to the second electrode pattern 118 at the other end thereof.

In FIG. 16B, the second electrodes 122 and the second inter-electrode patterns 124 of the second electrode pattern 118 (FIG. 11) have substantially the same structure as that in FIG. 16A, except that a smaller number of the second electrodes 122 are coupled together (are connected to each of the second lines 128) outside the display pixel area 108. In the embodiment shown in FIG. 16B, every third second electrode 122 is not connected to the second line 128.

Owing to such a structure, the value of the electrostatic capacitance of the second electrode pattern 118 (FIG. 11) can be adjusted, and thus the sensitivity of the sensing unit can be adjusted. In this case, it is preferable that dummy patterns that do not actually act as electrodes are provided between adjacent second electrode blocks 120.

Namely, between any two adjacent second electrode blocks 120, it is preferable that second inter-electrode patterns 124' are provided as dummy patterns as shown in FIG. 16A, or that the second inter-electrode patterns 124' and a second electrode 122' are provided as dummy patterns as shown in FIG. 16B. What dummy patterns are to be provided may be appropriately determined in consideration of the periodicity of the second electrode blocks 120. Owing to provision of such dummy patterns between adjacent second electrode blocks 120, the second electrode pattern 118 is guaranteed to have a periodicity and display non-uniformity (display lines), which could otherwise occur when a viewer views the display screen in an oblique direction, can be suppressed.

Figure 17:
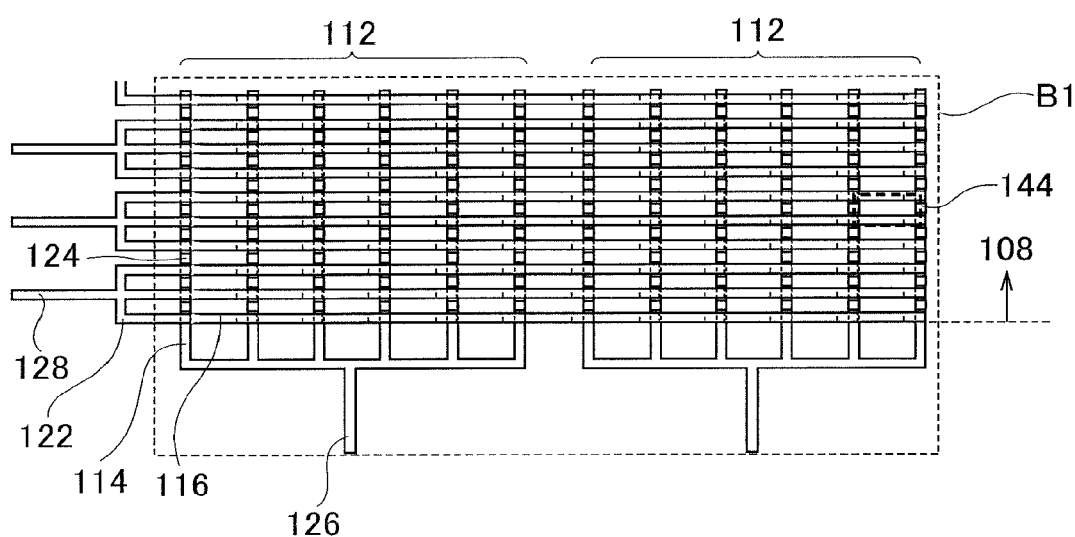
FIG. 17 is a plan view showing a structure of electrodes in a sensing unit of an organic electroluminescent display device in an embodiment according to the present invention.

FIG. 17 shows a detailed structure of the second electrode pattern 118 (FIG. 11) and the first electrode pattern 110 (FIG. 11) that are shown in FIG. 16A. In FIG. 17, the second electrodes 122 of the second electrode pattern 118 (FIG. 11) extend in one direction (X direction for the sake of convenience in FIG. 17), whereas the first electrodes 114 of the first electrode pattern 110 (FIG. 11) extend in a direction intersecting the one direction (Y direction for the sake of convenience in FIG. 17).

The first electrode pattern 110 (FIG. 11) and the second electrode pattern 118 (FIG. 11) are both provided so as to enclose the sub pixels 114. Therefore, even if the first electrode pattern 110 (FIG. 11) and the second electrode pattern 118 (FIG. 11) have a cut-off portion, the sub pixels 144 can be enclosed with no cut-off portion by locating the first electrode pattern 110 and the second electrode pattern 118 to overlap each other in a generally aligned manner. This can increase the inter-pixel (inter-sub pixel) light shielding property.

In FIG. 17, the first electrode pattern 110 (FIG. 11) and the second electrode pattern 118 (FIG. 11) are both provided so as to enclose the sub pixels 114. The present invention is not limited to such a structure. The first electrode pattern 110 (FIG. 11) and the second electrode pattern 118 (FIG. 11) may be provided so as to enclose pixels (display unit formed of a plurality of sub pixels).

Embodiment 3

In this embodiment, an organic electroluminescent display device having an input function in which the second electrode pattern in the sensing unit has a different structure from that in Embodiment 1 and Embodiment 2 will be described.

(1) Structure of the Module

Figure 18:
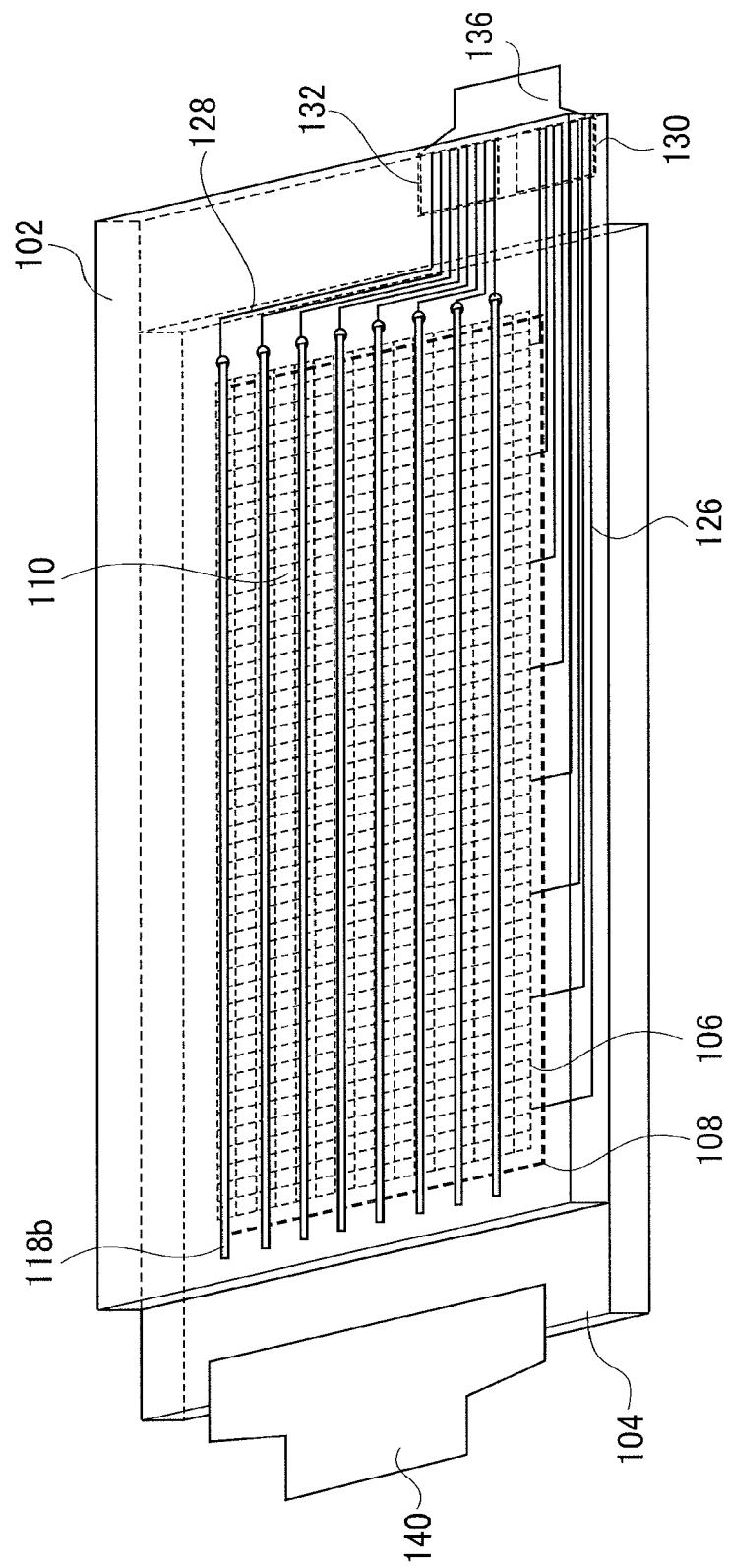
FIG. 18 is a perspective view showing an overview of a module of an organic electroluminescent display device in an embodiment according to the present invention.
Figure 19:
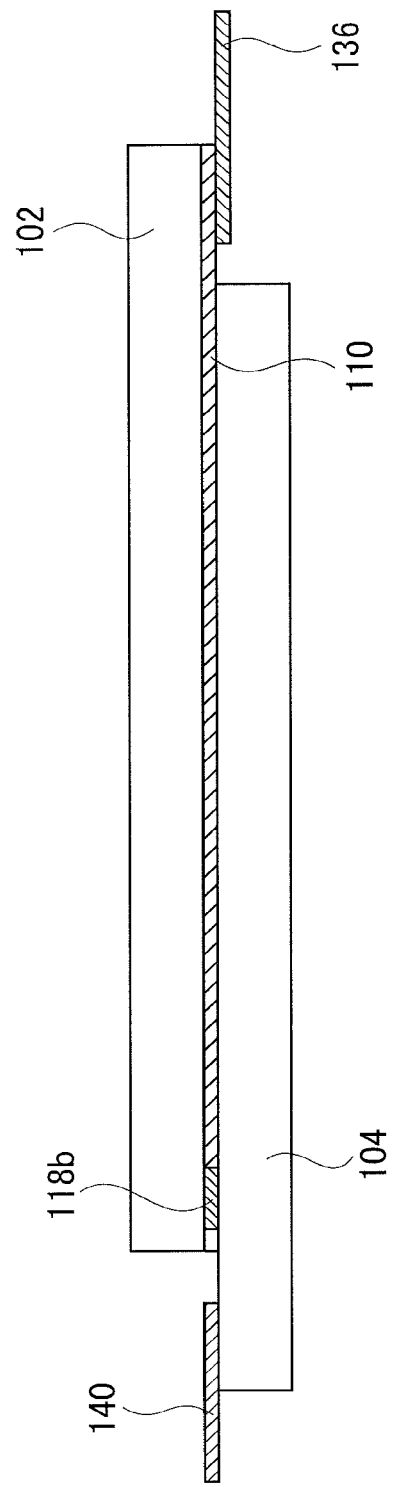
FIG. 19 is a cross-sectional view showing the overview of the module of the organic electroluminescent display device in the embodiment according to the present invention.

FIG. 18 shows a structure of a module of an organic electroluminescent display device having an input function in this embodiment. FIG. 19 is a schematic cross-sectional view of the module shown in FIG. 18. The module in this embodiment will be described with reference to FIG. 18 and FIG. 19. The structure of the first substrate 104 is the same as that described above in Embodiment 1 and will not be described again.

The sensing unit 106 of the organic electroluminescent display device includes the first electrode pattern 110 and the second electrode pattern 118b. The first electrode pattern 110 and the second electrode pattern 118b are both provided in an inner area held between the first substrate 104 and the second substrate 102.

The first electrode pattern 110 has substantially the same structure as that in Embodiment 1. The second electrode pattern 118b is provided at the same surface of the second substrate 102 as the first electrode pattern 110, but has substantially the same structure as that in Embodiment 1 except for this point.

The second substrate 102 includes the first terminal portion 130 electrically connected to the first electrode pattern 110 and the second terminal portion 132 electrically connected to the second electrode pattern 118b in the same surface. The first electrode pattern 110 and the first terminal portion 130 are connected to each other by the first lines 126. The second electrode pattern 118b and the second terminal portion 132 are connected to each other by the second lines 128. Since the first terminal portion 130 and the second terminal portion 132 are provided in the same surface, these terminal portions can be close to each other. With such an arrangement, one FPC can be used commonly for the terminal portions 130 and 132.

(2) Details of the Display Pixel Area

Figure 20:
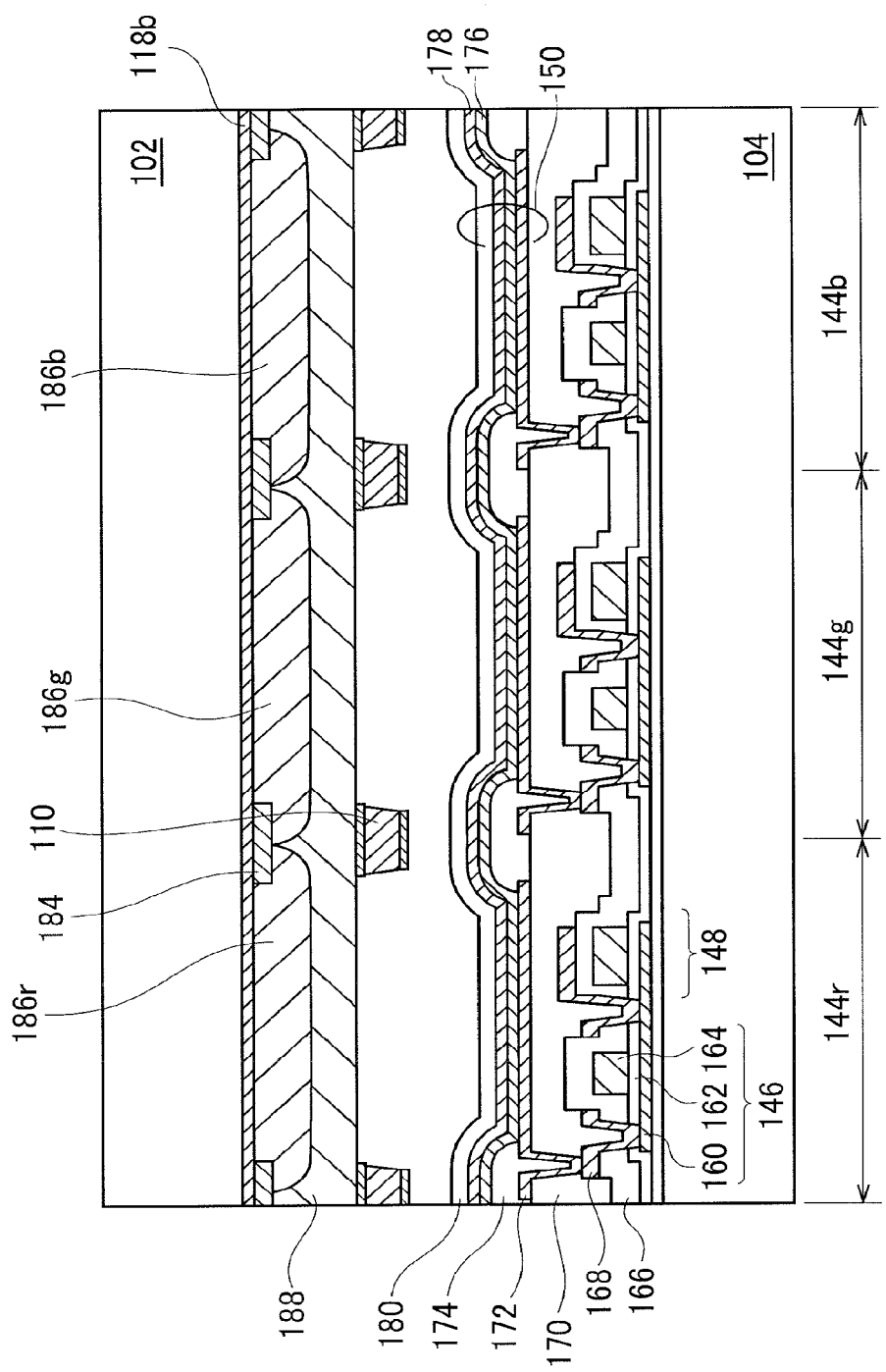
FIG. 20 is a cross-sectional view showing details of a pixel area of the organic electroluminescent display device in the embodiment according to the present invention.

With reference to FIG. 20, a structure of the pixel area of the organic electroluminescent display device in this embodiment will be described.

The second electrode pattern 118b is provided so as not to be in contact with the first electrode pattern 110 at the surface of the second substrate 104 facing the first substrate 102. Namely, the second electrode pattern 118b is provided to overlap the first electrode pattern 110 while having an insulating layer therebetween.

As shown in, for example, FIG. 20, the overcoat layer 188 formed of an insulating material may be provided between the second electrode pattern 118b and the first electrode pattern 110, so that the second electrode pattern 118b and the first electrode pattern 110 are not in direct contact with each other. In addition to the overcoat layer 188, the color filter layers 186 and/or the light shielding layer 184 may be provided between the first electrode pattern 110 and the second electrode pattern 118b. In this case, the light shielding layer 184 is preferably formed of an insulating layer so as not to be conductive with the second electrode pattern 118b.

As described above, the overcoat layer 118 and the color filter layers 186 are provided between the first electrode pattern 110 and the second electrode pattern 118b. Owing to this, shortcircuit, which would otherwise occur between the first electrode pattern 110 and the second electrode pattern 118b, can be prevented.

Figure 21:
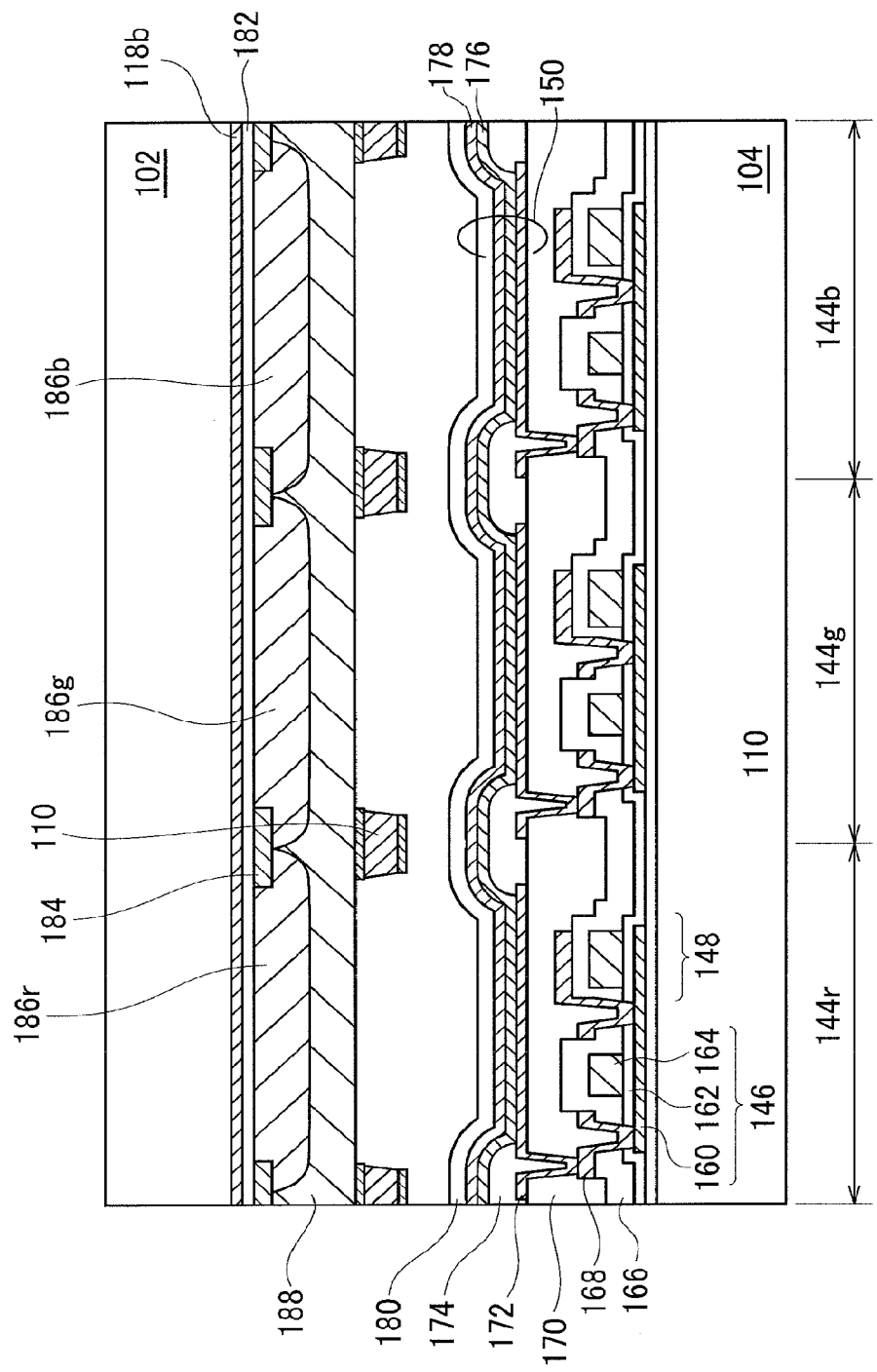
FIG. 21 is a cross-sectional view showing details of a pixel area of the organic electroluminescent display device in the embodiment according to the present invention.

FIG. 21 shows a structure including the protection film 182 provided in contact with the second electrode pattern 118b. In the case where, for example, the light shielding layer 184 is formed of a conductive metal material, provision of the protection film 182 can prevent the second electrode pattern 118b from being conductive with the light shielding layer 184.

The second electrode pattern 118b is formed of a transparent conductive material. The second electrode pattern 118b and the first electrode pattern 110 overlapping each other have substantially the same planar structure as that shown in FIG. 5. Therefore, the effects of suppressing the color mixture and the increasing the light utilization factor are also provided as in Embodiment 1.

In this embodiment, the first electrode pattern 110 and the second electrode pattern 118b are provided in the inner area of the panel (as held between the first substrate 104 and the second substrate 102) while having the insulating layer therebetween. This structure can decrease the thickness or the size of the organic electroluminescent display device. In addition, the second electrode pattern 118b is not exposed over the outer surface of the panel. Therefore, the second electrode pattern 118b is protected against damage or deterioration, and thus the reliability is improved.

In this embodiment, the first electrode pattern is provided closer to the first substrate and the second electrode pattern is provided closer to the second substrate while having the insulating layer therebetween. Alternatively, the positions of the first electrode pattern and the second electrode pattern may be replaced with each other.

Embodiment 4

In this embodiment, an organic electroluminescent display device having an input function in which the second electrode pattern in the sensing unit has a different structure from that in Embodiment 3 will be described.

(1) Structure of the Module

Figure 22:
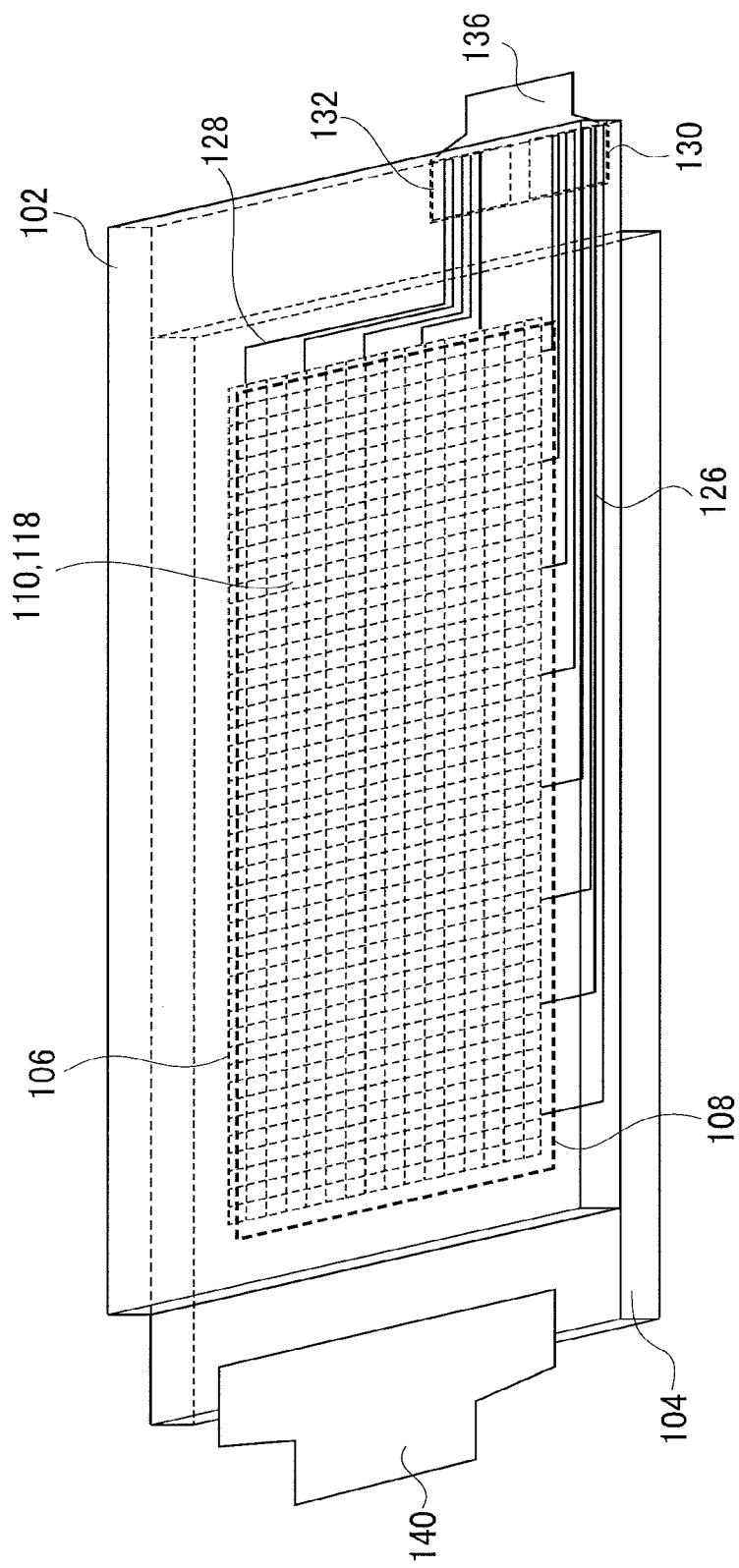
FIG. 22 is a perspective view showing an overview of a module of an organic electroluminescent display device in an embodiment according to the present invention.
Figure 23:
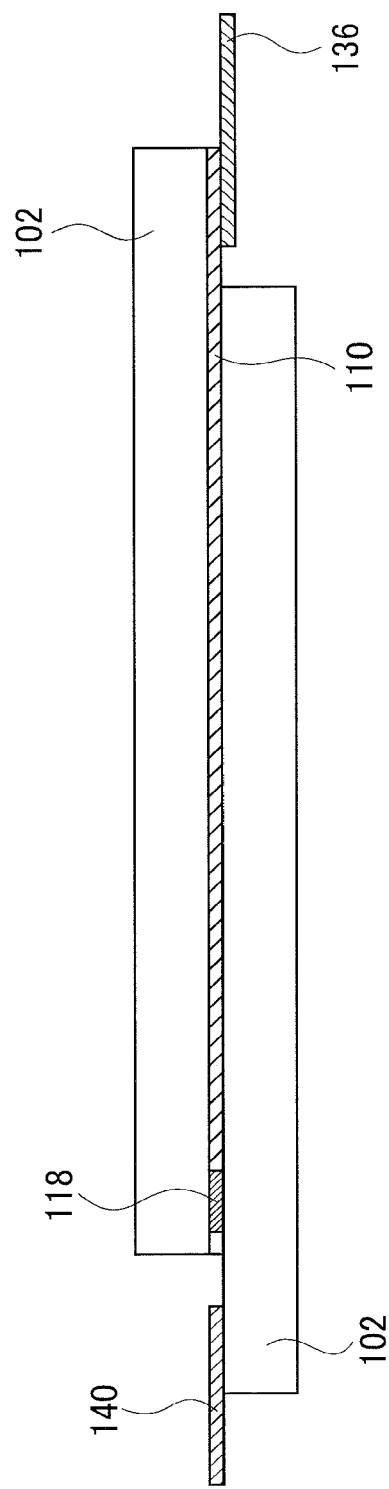
FIG. 23 is a cross-sectional view showing the overview of the module of the organic electroluminescent display device in the embodiment according to the present invention.

FIG. 22 shows a structure of a module of an organic electroluminescent display device having an input function in this embodiment. FIG. 23 is a schematic cross-sectional view of the module shown in FIG. 22. The module in this embodiment will be described with reference to FIG. 22 and FIG. 23. The structure of the first substrate 104 is the same as that described above in Embodiment 1 and will not be described again.

The sensing unit 106 of the organic electroluminescent display device includes the first electrode pattern 110 and the second electrode pattern 118. The first electrode pattern 110 and the second electrode pattern 118 are both provided in the inner area held between the first substrate 104 and the second substrate 102.

The first electrode pattern 110 has substantially the same structure as that in Embodiment 1. The second electrode pattern 118 has substantially the same structure as that in Embodiment 2. The first electrode pattern 110 and the second electrode pattern 118 overlapping each other have substantially the same planar structure as that shown in FIG. 13. The first electrode pattern 110 and the second electrode pattern 118 are provided so as to enclose the sub pixels.

In the organic electroluminescent display device shown in FIG. 22, the second electrode pattern 118 is formed of a metal material, and therefore the second lines 128 and the second terminal portion 132 can also be formed of a metal material. Therefore, the second terminal portion 132 can be located close to the first terminal portion 130. With such an arrangement, one FPC can be used commonly for the terminal portions 130 and 132. Therefore, the number of the FPCs required for the module can be decreased.

(2) Details of the Display Pixel Area

Figure 24:
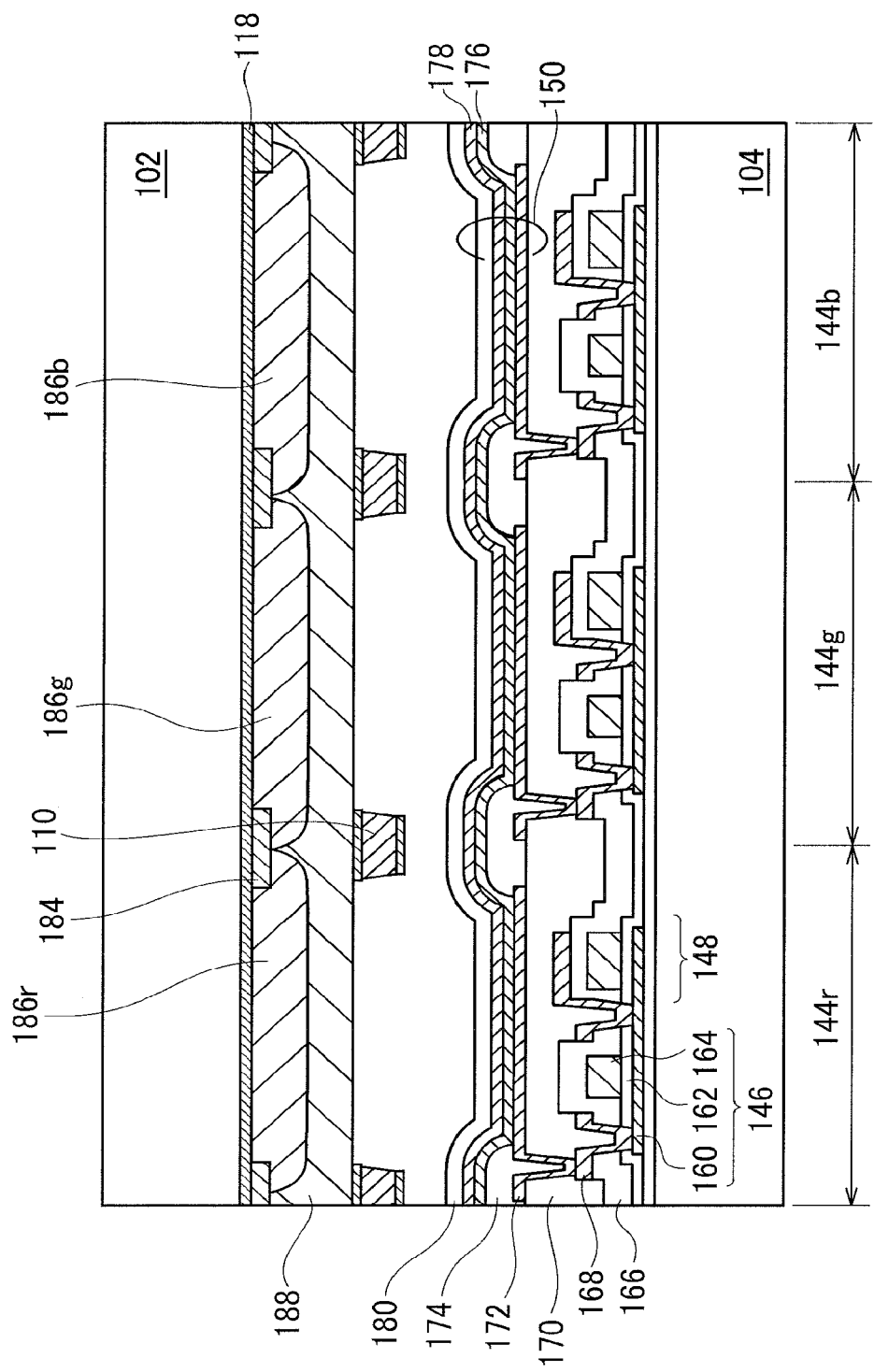
FIG. 24 is a cross-sectional view showing details of a pixel area of the organic electroluminescent display device in the embodiment according to the present invention.

With reference to FIG. 24, a structure of the pixel area of the organic electroluminescent display device in this embodiment will be described. Embodiment 4 is different from Embodiment 3 in the structure of the second electrode pattern 118. Therefore, the second electrode pattern 118 will be described below.

The second electrode pattern 118 is formed of a metal material such as, for example, titanium (Ti), tungsten (W), molybdenum (Mo) or the like as a conductive material having a low reflectance. The second electrode pattern 118 shown in FIG. 24 has substantially the same planar structure as that shown in FIG. 10A or FIG. 10B. The insulating layer is provided between the second electrode pattern 118 and the first electrode pattern 110. The insulating layer may be provided only for insulating the second electrode pattern 118 and the second electrode pattern 110 from each other, or may also act as the overcoat layer 188. The color filter layers 186 or the light shielding layer 184 may also be provided between the second electrode pattern 118 and the second electrode pattern 110.

Figure 25:
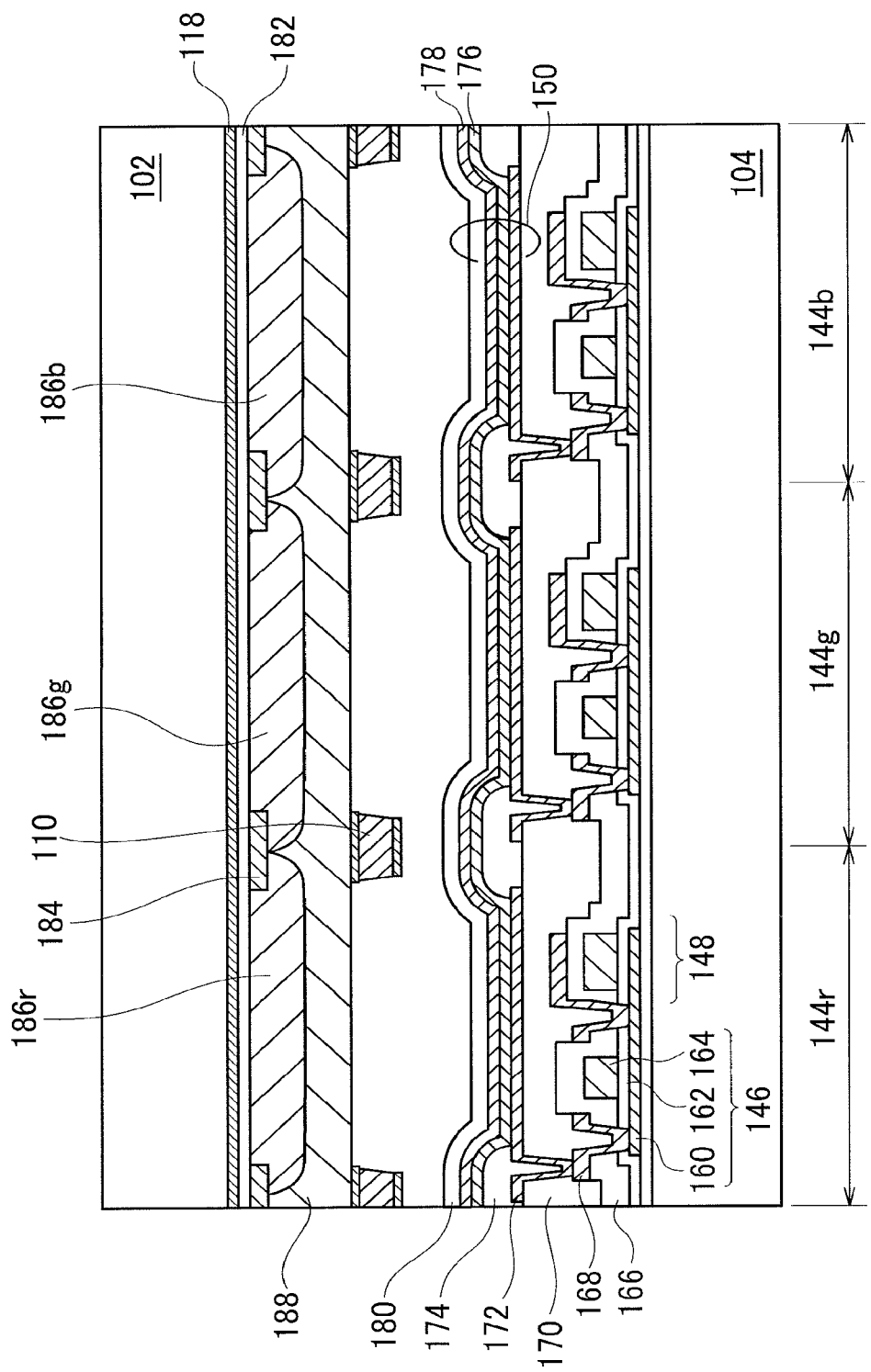
FIG. 25 is a cross-sectional view showing details of a pixel area of the organic electroluminescent display device in the embodiment according to the present invention.

FIG. 25 shows a structure including the protection film 182 provided to be in contact with the second electrode pattern 118. In the case where, for example, the light shielding layer 184 is formed of a conductive metal material, provision of the protection film 182 can prevent the second electrode pattern 118 from being conductive with the light shielding layer 184.

The second electrode pattern 118 is formed of a transparent conductive material. The second electrode pattern 118 and the first electrode pattern 110 overlapping each other have substantially the same planar structure as that shown in FIG. 13. Therefore, the effects of suppressing the color mixture and the increasing the light utilization factor are also provided as in Embodiment 2.

In this embodiment, the first electrode pattern 110 and the second electrode pattern 118 are provided in the inner area of the panel (as being held between the first substrate 104 and the second substrate 102) while having the insulating layer therebetween. This structure can decrease the thickness or the size of the organic electroluminescent display device. In addition, the second electrode pattern 118 is not exposed over the outer surface of the panel. Therefore, the second electrode pattern 118 is protected against damage or deterioration, and thus the reliability is improved. Since the second electrode pattern 118 is provided so as to enclose the pixel electrodes like the first electrode pattern 110, the light leaks are prevented, and image quality deterioration, which would be caused by the inter-sub pixel color mixture, can be prevented.

Embodiment 5

In this embodiment, an organic electroluminescent display device having an input function in which the first electrode pattern and the second electrode pattern in the sensing unit are both provided in the inner area between the first substrate and the second substrate and the lines connected to the electrode patterns have a different structure from that in the above embodiments will be described.

Figure 26:
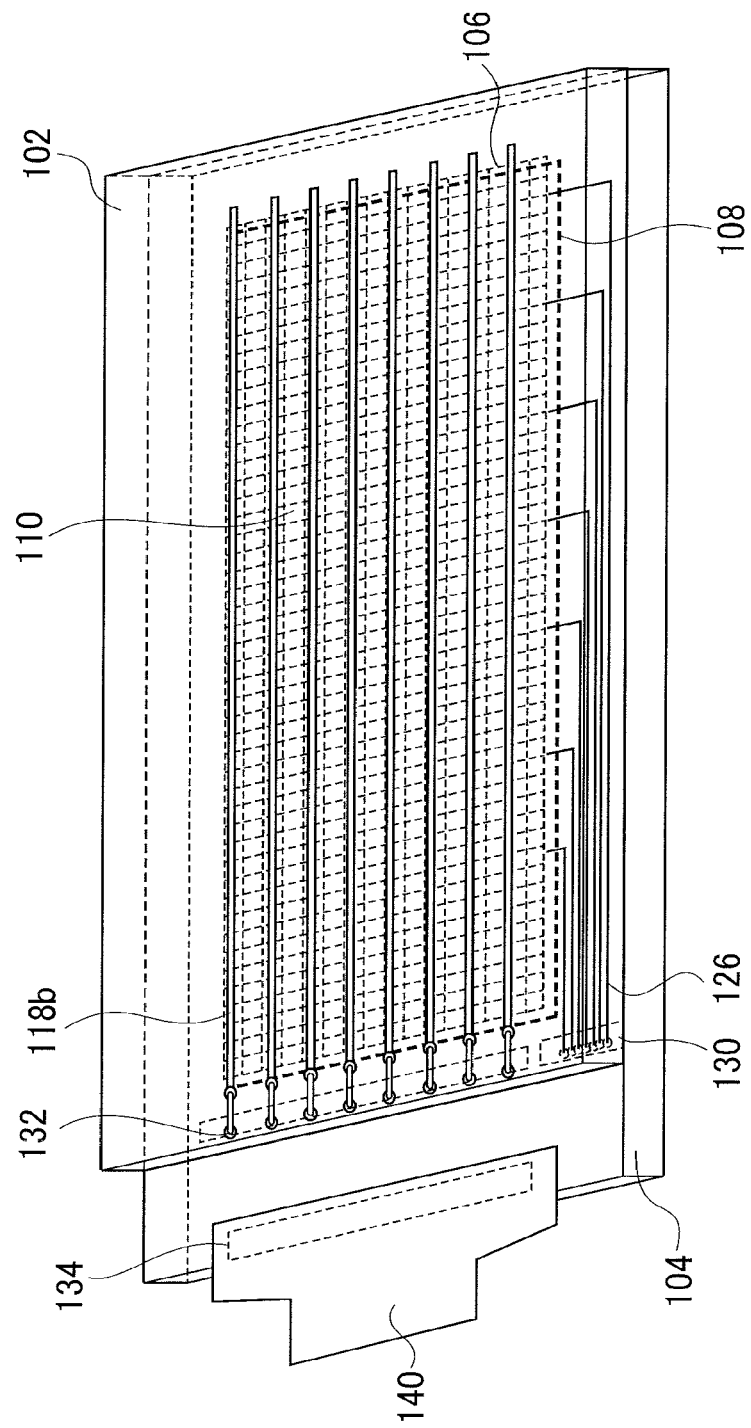
FIG. 26 is a perspective view showing an overview of a module of an organic electroluminescent display device in an embodiment according to the present invention.
Figure 27:
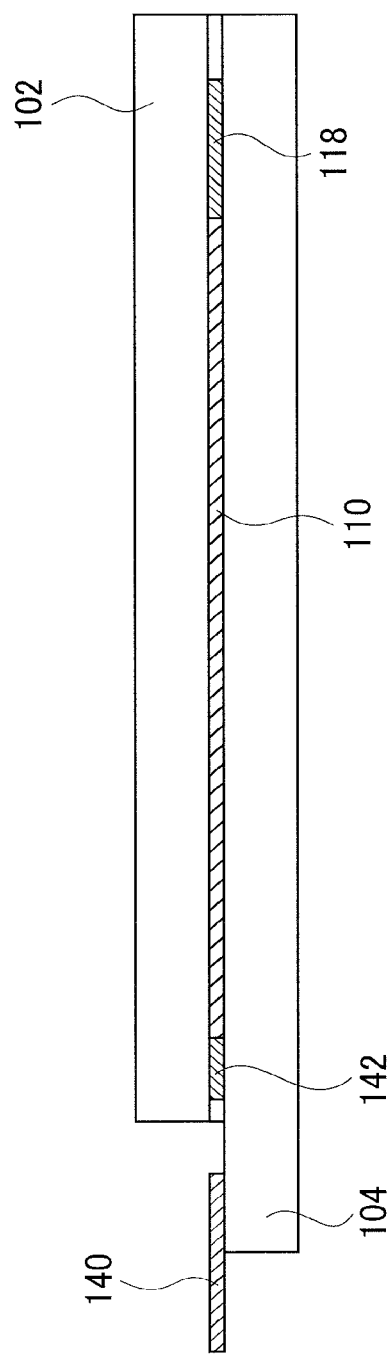
FIG. 27 is a cross-sectional view showing the overview of the module of the organic electroluminescent display device in the embodiment according to the present invention.

FIG. 26 shows a structure of a module of an organic electroluminescent display device having an input function in this embodiment. FIG. 27 is a schematic cross-sectional view of the module shown in FIG. 26. The module in this embodiment will be described with reference to FIG. 26 and FIG. 27. The structure of the first substrate 104 is the same as that described above in Embodiment 1 and will not be described again. The details of the first electrode pattern 110 and the second electrode pattern 118b are substantially the same as those in Embodiment 1 and will not be described again.

As shown in FIG. 26, the first electrode pattern 110 and the second electrode pattern 118b are both provided at the same surface of the second substrate 102 (surface facing the first substrate 104). The first lines 126 and the second lines 128b are located to be drawn to an end area of the second substrate 102. The first terminal portion 130 and the second terminal portion 132 having a contact with the first substrate 104 are provided in the end area of the second substrate 102.

The first terminal portion 130 and the second terminal portion 132 are connected by a connection electrode 142 to predetermined lines provided over the first substrate 104. The first terminal portion 130 and the second terminal portion 132 are connected to a third terminal portion 134 by the lines in the first substrate 104. Owing to such a structure, the first electrode pattern 110, the second electrode pattern 118b, and the connection terminals with an external circuit are all connected to the third terminal portion 134. Therefore, merely one FPC is needed for connection with the external circuit, which can decrease the size of the display panel.

In FIG. 26, the first terminal portion 130 and the second terminal portion 132 are provided in the end area close to the third terminal portion 134 provided in the first substrate 104. The first terminal portion 130 and the second terminal portion 132 are not limited to being located in such an area, and may be provided in any area where the first terminal portion 130 and the second terminal portion 132 can contact the first substrate 104 easily. It should be noted that in the case where the first terminal portion 130 and the second terminal portion 132 are provided in an end area close to the third terminal portion 134, the length of the lines required to be drawn in the first substrate 104 can be shortened.

Figure 28:
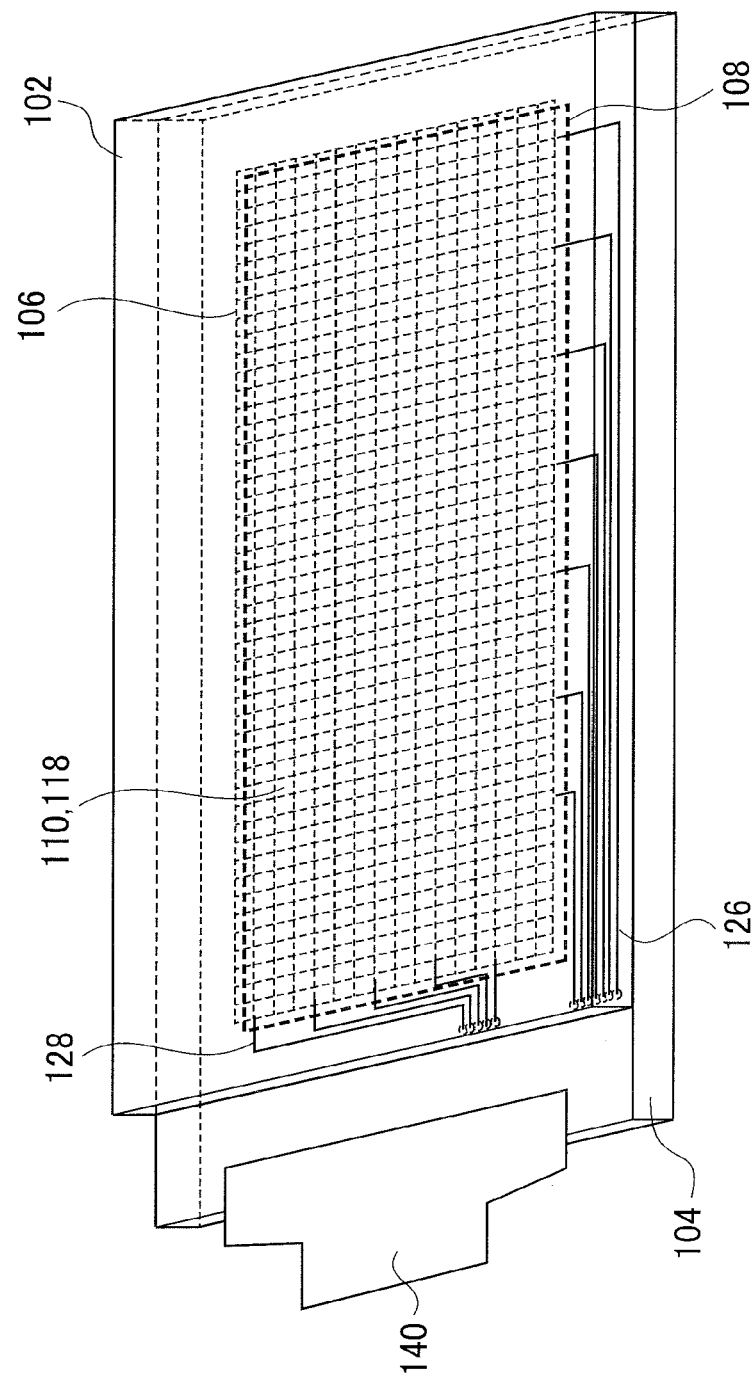
FIG. 28 is a perspective view showing an overview of a module of an organic electroluminescent display device in an embodiment according to the present invention.
Figure 29:
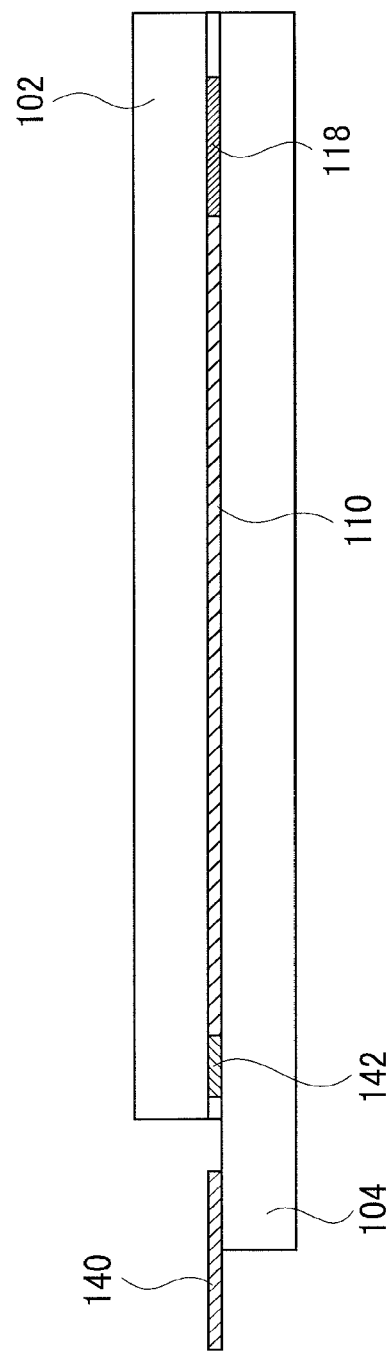
FIG. 29 is a cross-sectional view showing the overview of the module of the organic electroluminescent display device in the embodiment according to the present invention.

FIG. 28 shows an organic electroluminescent display device in which the lines connected to the electrode patterns have a different structure from that in the above embodiments, and FIG. 29 is a schematic cross-sectional view thereof. The first electrode pattern 110 and the second electrode pattern 118 are substantially the same as those in Embodiment 2, and will not be described in detail.

In the structure shown in FIG. 28 and FIG. 29, output terminals of the first electrode pattern 110 and the second electrode pattern 118 can be located in the inner area of the panel. Therefore, the number of flexible printed circuit boards required for forming a module can be decreased. This can decrease the size of the organic electroluminescent display device.

As described so far, a display device in an embodiment according to the present invention is applicable to any of various electronic devices that require a graphical user interface. The display device in an embodiment according to the present invention is applicable for, for example, computer devices and mobile electronic devices which are operated by a touch over an image over the display screen, and also electronic devices for special purposes including TVs, image monitors, information panels, digital signage, ticket vending machines, cash dispensers and the like.

What is claimed is:
1. A display device comprising:
a first substrate having a pixel area including a plurality of pixels; and
a second substrate facing the first substrate and having a sensing unit including a first electrode pattern and a second electrode pattern which is separated and insulated from the first electrode pattern,
wherein the pixel area and the first electrode pattern face each other,
the first electrode pattern includes a plurality of first electrodes running in a first direction and a plurality of first inter-electrode patterns running in a second direction intersecting the first direction,
a part of the second electrode pattern is running in a third direction intersecting the first direction, and
an entirety of each of the first inter-electrode patterns is located between two of the first electrodes which are adjacent to each other and separated from at least one side of the two of the first electrodes.
2. The display device according to claim 1, wherein the second direction and the third direction is a same direction.
3. The display device according to claim 1, wherein the pixel area includes a border between the pixels, and
the first electrodes overlap the border.
4. The display device according to claim 1, wherein two of the first inter-electrode patterns which are adjacent to each other and the two of the first electrodes enclose at least one of the pixels.
5. The display device according to claim 1, wherein each of the first electrodes has a top surface, bottom surface, and a side surface between the top surface and the bottom surface,
the top surface is located at an opposite side of the bottom surface from the first substrate and larger than the bottom surface, and
the side surface is inclined.
6. The display device according to claim 5, wherein the side surface is a light-reflecting surface.

7. The display device according to claim 1, wherein the first electrode pattern has a plurality of first electrode blocks,
a plurality of first lines is located on the second substrate, each of the first lines corresponding to each of the first electrode blocks,
each of the first electrode blocks includes at least two of the first electrodes, and
the at least two of the first electrodes are connected to one of the first lines.
8. The display device according to claim 7, wherein the first electrode pattern includes a dummy pattern between two of the first electrode blocks which are adjacent to each other.
9. The display device according to claim 1, wherein the second electrode pattern includes planar shapes covering at least two of the first electrodes and at least two of the first inter-electrode patterns.
10. The display device according to claim 9, wherein the second electrode pattern includes a plurality of second electrodes and a plurality of second inter-electrode patterns,
each of the second electrodes has each of the planar shapes,
at least two of the second electrodes is arranged along the third direction and connected to a second line, and
the second line is located between two of the second inter-electrode patterns which is adjacent to each other.
11. The display device according to claim 1, wherein the second electrode pattern includes a plurality of second electrodes running in the third direction and a plurality of second inter-electrode patterns running in the first direction, and
an entirety of each of the second inter-electrode patterns are located between two of the second electrodes which are adjacent to each other and separated from at least one side of the two of the second electrodes.
12. The display device according to claim 11, wherein the second electrode pattern has second electrode blocks,
a plurality of second lines is located on the second substrate, each of the second lines corresponding to each of the second electrode blocks,
each of the second electrode blocks includes at least two of the second electrodes, and
the at least two of the second electrodes are connected to one of the second lines.
13. The display device according to claim 12, wherein the second electrode pattern includes a dummy pattern between two of the second electrode blocks which are adjacent to each other.
14. The display device according to claim 11, wherein two of the second inter-electrode patterns which are adjacent to each other and the two of the second electrodes enclose at least one of the pixels.
15. The display device according to claim 1, wherein each of the first inter-electrode patterns is separated from one of the two of the first electrodes and is in contact with another of the two of the first electrodes.
16. The display device according to claim 1, wherein the first electrode pattern and the second electrode pattern have substantially the same pattern, and
the first electrodes overlap the part of the second electrode pattern.
17. The display device according to claim 1, wherein the first electrode pattern and the second electrode pattern are located on a surface of the second substrate, the surface facing the first substrate.

18. A display device comprising:
a first substrate having a pixel area including a plurality of pixels and a partition layer demarcating the pixels, each of the pixels including a pixel electrode, a light emitting layer, and a counter electrode; and
a second substrate facing the first substrate and having a sensing unit including a first electrode pattern and a second electrode pattern which is separated and insulated from the first electrode pattern,
wherein the pixel area and the first electrode pattern face each other,
the first electrode pattern includes a plurality of first electrodes running in a first direction and a plurality of first inter-electrode patterns running in a second direction intersecting the first direction,
the first electrodes overlap the partition layer in a planar view,
a part of the second electrode pattern is running in a third direction intersecting the first direction, and
an entirety of each of the first inter-electrode patterns is located between two of the first electrodes which are adjacent to each other and separated from at least one side of the two of the first electrodes.

19. The display device according to claim 18, wherein the first inter-electrode patterns overlap the partition layer in a planar view.

20. The display device according to claim 18, wherein two of the first inter-electrode patterns which are adjacent to each other and the two of the first electrodes enclose at least one of the pixels.

* * * * *